(12) United States Patent
Arnold et al.

(10) Patent No.: US 11,189,783 B2
(45) Date of Patent: Nov. 30, 2021

(54) EMBEDDED MRAM DEVICE FORMATION WITH SELF-ALIGNED DIELECTRIC CAP

(71) Applicant: INTERNATIONAL BUSINESS MACHINES CORPORATION, Armonk, NY (US)

(72) Inventors: John Arnold, North Chatham, NY (US); Dominik Metzler, Saratoga Springs, NY (US); Ashim Dutta, Menands, NY (US); Donald Canaperi, Bridgewater, CT (US)

(73) Assignee: INTERNATIONAL BUSINESS MACHINES CORPORATION, Armonk, NY (US)

( * ) Notice: Subject to any disclaimer, the term of this patent is extended or adjusted under 35 U.S.C. 154(b) by 12 days.

(21) Appl. No.: 16/578,729

(22) Filed: Sep. 23, 2019

(65) Prior Publication Data

US 2021/0091301 A1  Mar. 25, 2021

(51) Int. Cl.
| | | |
|---|---|---|
| *H01L 45/00* | (2006.01) | |
| *H01L 43/02* | (2006.01) | |
| *H01L 27/22* | (2006.01) | |
| *H01L 43/12* | (2006.01) | |
| *H01L 43/10* | (2006.01) | |
| *H01L 43/08* | (2006.01) | |
| *H01L 41/27* | (2013.01) | |
| *H01L 41/22* | (2013.01) | |

(Continued)

(52) U.S. Cl.
CPC ............ *H01L 43/02* (2013.01); *G11C 11/161* (2013.01); *H01L 27/222* (2013.01); *H01L 41/22* (2013.01); *H01L 41/27* (2013.01); *H01L 43/04* (2013.01); *H01L 43/08* (2013.01); *H01L 43/10* (2013.01); *H01L 43/12* (2013.01); *H01L 45/1233* (2013.01); *H01L 45/1253* (2013.01); *H01L 45/16* (2013.01)

(58) Field of Classification Search
CPC ......... H01L 43/02; H01L 43/10; H01L 43/08; H01L 43/12; H01L 27/222; H01L 43/04; H01L 45/1253; H01L 45/1233; H01L 45/16; H01L 41/22; H01L 41/27; G11C 11/161

See application file for complete search history.

(56) References Cited

U.S. PATENT DOCUMENTS

| | | |
|---|---|---|
| 8,105,867 B2 | 1/2012 | Matamis et al. |
| 8,129,268 B2 | 3/2012 | Breitwisch |
| 9,070,869 B2 | 6/2015 | Jung et al. |

(Continued)

*Primary Examiner* — Feifei Yeung Lopez
(74) *Attorney, Agent, or Firm* — Cantor Colburn LLP; L. Jeffrey Kelly

(57) ABSTRACT

Methods for forming an integrated circuit are provided. Aspects include providing a wafer substrate having an embedded memory area interconnect structure and an embedded non-memory area interconnect structure, the memory area interconnect structure comprising metal interconnects formed within a first interlayer dielectric, recessing a portion of the memory area interconnect structure, forming a bottom electrode contact on the recessed portion of the memory area interconnect structure, forming a bottom electrode over the bottom electrode contact, forming a protective dielectric layer over the non-memory area interconnect structure, and forming memory element stack layers on a portion of the bottom electrode.

14 Claims, 16 Drawing Sheets

(51) Int. Cl.
  *H01L 43/04*   (2006.01)
  *G11C 11/16*   (2006.01)

(56) References Cited

U.S. PATENT DOCUMENTS

| | | |
|---|---|---|
| 9,343,659 B1 | 5/2016 | Lu et al. |
| 9,553,128 B1 | 1/2017 | Annunziata et al. |
| 2006/0024950 A1* | 2/2006 | Choi ............... H01L 45/148 438/626 |
| 2010/0019215 A1 | 1/2010 | Lung et al. |
| 2010/0203672 A1* | 8/2010 | Eun ................ H01L 45/1233 438/102 |
| 2011/0186797 A1 | 8/2011 | Herner |
| 2013/0119494 A1 | 5/2013 | Li et al. |
| 2014/0061827 A1 | 3/2014 | Huang et al. |
| 2014/0284734 A1* | 9/2014 | Kanaya ............. H01L 43/02 257/421 |
| 2016/0365505 A1 | 12/2016 | Lu et al. |
| 2018/0040814 A1* | 2/2018 | Park ................. G06F 3/0673 |
| 2019/0326353 A1* | 10/2019 | O'Brien ............ H01F 10/3254 |
| 2019/0393409 A1* | 12/2019 | Maniscalco ......... H01L 23/528 |
| 2021/0110857 A1* | 4/2021 | Endoh ................ G11C 11/16 |

\* cited by examiner

EMBEDDED MRAM DEVICE FORMATION WITH SELF-ALIGNED DIELECTRIC CAP

BACKGROUND

The present invention generally relates to fabrication methods and resulting structures for semiconductor devices. More specifically, the present invention relates to fabrication methods and resulting structures for an embedded magnetoresistive random-access memory (MRAM) device having bottom electrode contacts formed in a self-aligned dielectric cap.

ICs are fabricated in a series of stages, including front-end-of-line (FEOL) stages, middle-of-line (MOL) stages and back-end-of-line (BEOL) stages. The process flows for fabricating modern ICs are often identified based on whether the process flows fall in the FEOL stages, the MOL stages, or the BEOL stages. Generally, the FEOL stages are where device elements (e.g., transistors, capacitors, resistors, etc.) are patterned in the semiconductor substrate/wafer. The FEOL stages (or logical layers) include wafer preparation, isolation, and gate patterning, along with the formation of wells, source/drain (S/D) regions, extension junctions, silicide regions, and liners. The MOL stages (or functional layers) typically include process flows for forming the contacts and other structures that couple to active regions (e.g., gate/source/drain) of the FEOL device elements. Networks of interconnect structures (e.g., conductive lines and vias) are formed above these logical and functional layers during the BEOL stage to complete the IC.

MRAM can be formed from memory structures such as magnetic tunnel junction (MTJ) stacks, which can be embedded in BEOL interconnect structures. The MTJ stack can be electrically accessed through top and bottom contacts/electrodes that are coupled to top and bottom ends, respectively, of the MTJ stack.

SUMMARY

Embodiments of the present invention are directed to a method for forming an integrated circuit. A non-limiting example of the method includes providing a wafer substrate having an embedded memory area interconnect structure and an embedded non-memory area interconnect structure, the memory area interconnect structure comprising metal interconnects formed within a first interlayer dielectric, recessing a portion of the memory area interconnect structure, forming a bottom electrode contact on the recessed portion of the memory area interconnect structure, forming a bottom electrode over the bottom electrode contact, forming a protective dielectric layer over the non-memory area interconnect structure, and forming memory element stack layers on a portion of the bottom electrode.

Embodiments of the present invention are directed to a method of forming an integrated circuit. A non-limiting example of the method includes providing a wafer substrate having an embedded memory area interconnect structure and an embedded non-memory area interconnect structure, the memory area interconnect structure comprising metal interconnects formed within a first interlayer dielectric, recessing a portion of the memory area interconnect structure, forming a bottom electrode contact on the recessed portion of the memory area interconnect structure, forming a metal cap layer over the dielectric material cap and the bottom electrode contact, forming a protective dielectric layer over the metal cap layer, selectively etching the protective dielectric layer over the memory area to expose a portion of the metal cap layer, and forming memory element stack layers on the exposed portion of the metal cap layer.

Embodiments of the invention are directed to an embedded memory element structure that includes a wafer having an embedded memory area interconnect structure dielectric and an embedded non-memory area interconnect structure, the memory area interconnect structure including metal interconnects formed within a first interlayer dielectric, a bottom electrode contact formed in a cavity of a dielectric material formed in a recessed portion of the memory area interconnect structure, a memory element pillar embedded in a second interlayer dielectric region, a first top contact communicatively coupled to a top electrode of the memory element pillar, and a second top contact communicatively coupled to the non-memory area interconnect structure.

Additional technical features and benefits are realized through the techniques of the present invention. Embodiments and aspects of the invention are described in detail herein and are considered a part of the claimed subject matter. For a better understanding, refer to the detailed description and to the drawings.

BRIEF DESCRIPTION OF THE DRAWINGS

The specifics of the exclusive rights described herein are particularly pointed out and distinctly claimed in the claims at the conclusion of the specification. The foregoing and other features and advantages of the embodiments of the invention are apparent from the following detailed description taken in conjunction with the accompanying drawings in which:

FIGS. 1-9 depict a portion of an IC structure after fabrication operations for forming MTJ memory elements having bottom electrode contacts formed in a self-aligned dielectric cap according to embodiments of the invention, in which:

FIG. 1 depicts a cross-sectional view of a semiconductor wafer after fabrication operations according to embodiments of the invention;

FIG. 2 depicts a cross-sectional view of a semiconductor wafer after fabrication operations according to embodiments of the invention;

FIG. 3 depicts a cross-sectional view of a semiconductor wafer after fabrication operations according to embodiments of the invention;

FIG. 4 depicts a cross-sectional view of a semiconductor wafer after fabrication operations according to embodiments of the invention;

FIG. 5 depicts a cross-sectional view of a semiconductor wafer after fabrication operations according to embodiments of the invention;

FIG. 6 depicts a cross-sectional view of a semiconductor wafer after fabrication operations according to embodiments of the invention;

FIG. 7 depicts a cross-sectional view of a semiconductor wafer after fabrication operations according to embodiments of the invention;

FIG. 8 depicts a cross-sectional view of a semiconductor wafer after fabrication operations according to embodiments of the invention;

FIG. 9 depicts a cross-sectional view of a semiconductor wafer after fabrication operations according to embodiments of the invention;

FIGS. 10-14 depict a portion of an IC structure after fabrication operations for forming MTJ memory elements having bottom electrode contacts formed in a self-aligned dielectric cap according to embodiments of the invention, in which:

FIG. 10 depicts a cross-sectional view of a semiconductor wafer after fabrication operations according to embodiments of the invention;

FIG. 11 depicts a cross-sectional view of a semiconductor wafer after fabrication operations according to embodiments of the invention;

FIG. 12 depicts a cross-sectional view of a semiconductor wafer after fabrication operations according to embodiments of the invention;

FIG. 13 depicts a cross-sectional view of a semiconductor wafer after fabrication operations according to embodiments of the invention;

FIG. 14 depicts a cross-sectional view of a semiconductor wafer after fabrication operations according to embodiments of the invention;

Figure 1:
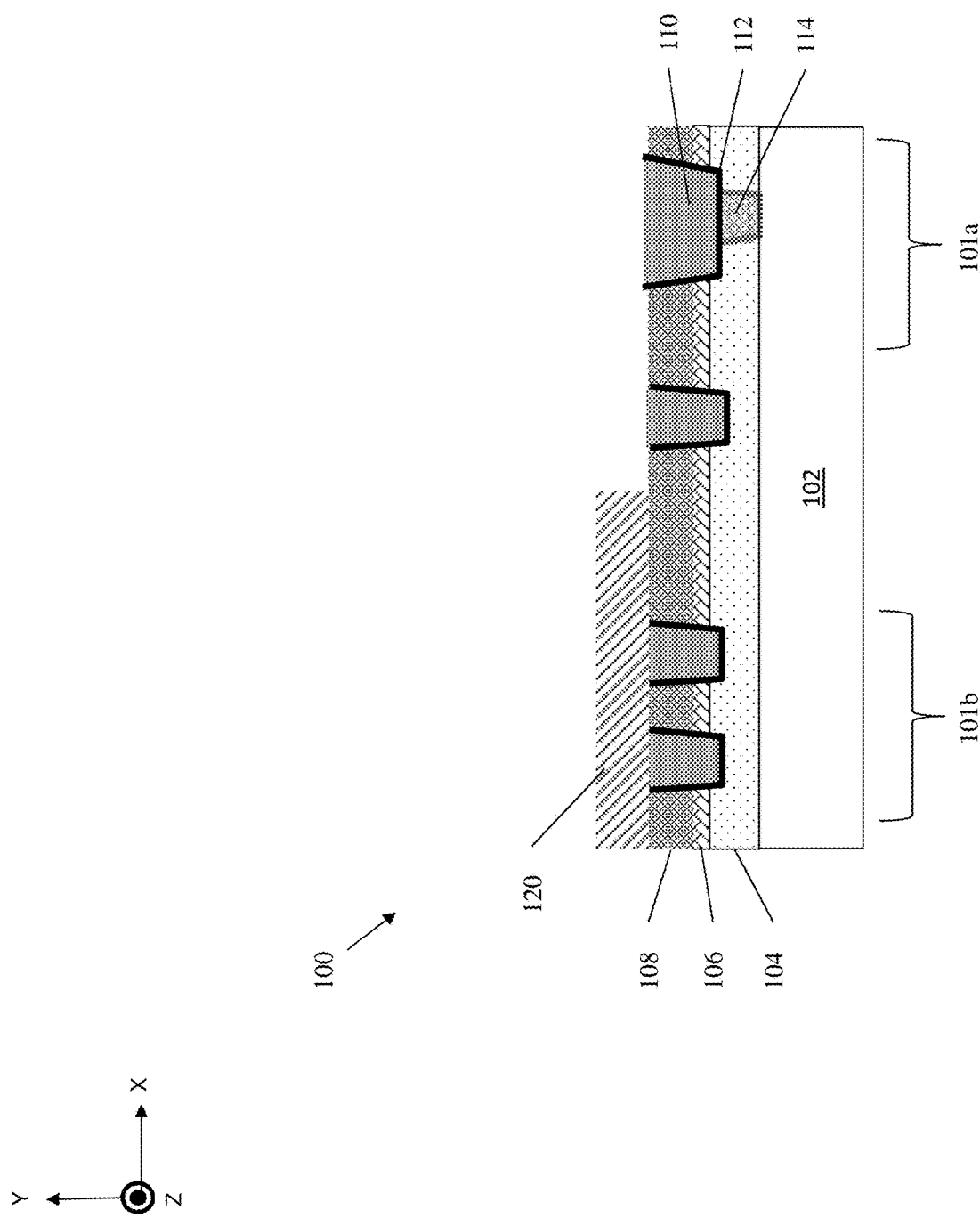

The diagrams depicted herein are illustrative. There can be many variations to the diagram or the operations described therein without departing from the spirit of the invention. For instance, the actions can be performed in a differing order or actions can be added, deleted or modified. Also, the term "coupled" and variations thereof describes having a communications path between two elements and does not imply a direct connection between the elements with no intervening elements/connections between them. All of these variations are considered a part of the specification.

In the accompanying figures and following detailed description of the described embodiments, the various elements illustrated in the figures are provided with two or three digit reference numbers. With minor exceptions, the leftmost digit(s) of each reference number correspond to the figure in which its element is first illustrated.

DETAILED DESCRIPTION

For the sake of brevity, conventional techniques related to semiconductor device and integrated circuit (IC) fabrication may or may not be described in detail herein. Moreover, the various tasks and process steps described herein can be incorporated into a more comprehensive procedure or process having additional steps or functionality not described in detail herein. In particular, various steps in the manufacture of semiconductor devices and semiconductor-based ICs are well known and so, in the interest of brevity, many conventional steps will only be mentioned briefly herein or will be omitted entirely without providing the well-known process details.

Turning now to an overview of technologies that are more specifically relevant to aspects of the invention, with the growth of digital data applications, there is a need for increasingly fast and scalable memory technologies for data storage and data-driven computation. Electronic memory can be classified as volatile or non-volatile. Volatile memory retains its stored data only when power is supplied to the memory, but non-volatile memory retains its stored data without constant power. Volatile random access memory (RAM) provides fast read/write speeds and easy re-write capability. However, when system power is switched off, any information not copied from volatile RAM to a hard drive is lost. Although non-volatile memory does not require constant power to retain its stored data, it in general has lower read/write speeds and a relatively limited lifetime in comparison to volatile memory.

Magnetoresistive random access memory (MRAM) is a non-volatile memory that combines a magnetic device with standard silicon-based microelectronics to achieve the combined attributes of non-volatility, high-speed read/write operations, high read/write endurance and data retention. The term "magnetoresistance" describes the effect whereby a change to certain magnetic states of the MTJ storage element (or "bit") results in a change to the MTJ resistance, hence the name "Magnetoresistive" RAM. A basic MTJ stack includes a free layer and a fixed/reference layer, each of which includes a magnetic material layer. The free and reference layers are separated by a non-magnetic insulating tunnel barrier. The free layer and the reference layer are magnetically de-coupled by the tunnel barrier. The free layer has a variable magnetization direction, and the reference layer has an invariable magnetization direction.

An MTJ stack stores information by switching the magnetization state of the free layer. When the free layer's magnetization direction is parallel to the reference layer's magnetization direction, the MTJ is in a low resistance state. Conversely, when the free layer's magnetization direction is anti-parallel to the reference layer's magnetization direction, the MTJ is in a high resistance state. The difference in resistance of the MTJ can be used to indicate a logical "1" or "0," thereby storing a bit of information. The tunneling magnetoresistance (TMR or MR) of an MTJ determines the difference in resistance between the high and low resistance states. A relatively high difference between the high and low resistance states facilitates read operations in the MRAM.

In embedded MRAM devices, fabrication operations (e.g., ion beam etching) used to form the MTJ stack can result in significant gouging of the dielectric regions that are underneath the bottom electrode of the MTJ. This can result in the removal of most or all of the dielectric cap layer in both memory and logic areas in the MRAM device, thus exposing copper lines of the interconnect (or metallization) layer below.

Turning now to an overview of the aspects of the invention, one or more embodiments of the invention address the above-described shortcomings of the prior art by providing fabrication methodologies and resulting structures for forming embedded MRAM devices configured and arranged to provide an under-MTJ dielectric configured to absorb IBE over-etch during the MRAM etching process without increasing the distance between the metal layers. In some aspects of the invention, this result can be achieved by creating an extra dielectric layer underneath MRAM pillars in the memory area by recessing metal in the bottom metal layer and filling the recessed area with a dielectric before forming the bottom electrode connection. In the logic area, an additional layer of dielectric is deposited to absorb IBE gouging without exposing the copper (Cu) using a block mask. Alternatively or in addition, the additional layer of dielectric can be combined with a metal cap that absorbs IBE gouging without exposing the copper (Cu) using a block mask.

Turning now to a more detailed description of aspects of the present invention, FIG. 1 depicts a portion of a multi-layered IC (or semiconductor wafer) 100 after an initial set of fabrication operations in accordance with aspects of the invention. The multi-layered IC 100 is depicted in two-dimensions (2D) extending along the y-axis and the x-axis. However, it is understood that the multi-layered IC 100 is a three-dimensional structure that also extends along the z-axis. The structural elements that extend in the z-axis direction are evident to a person skilled in the art based on the descriptions herein or general knowledge of MTJ structures. Accordingly, certain details of the relevant structure in the z-axis direction are in some instances either omitted or described and illustrated at a high level in the interest of brevity. A variety of well-known fabrication operations are suitable for forming the multi-layered IC 100 to the fabrication stage shown in FIG. 1. Accordingly, in the interest of brevity, such well-known fabrication operations are either omitted or described and illustrated at a high level.

At the fabrication stage shown in FIG. 1, suitable fabrication operations have been used to form a substrate 102 with a memory area 101a and a logic area 101b of the substrate 102. In some embodiments of the invention, the substrate 102 can include various MOL and FEOL structures. FEOL structures can include structures such as wells, source/drain (S/D) regions, extension junctions, silicide regions, liners, and the like. The MOL structures can include contacts and other structures that couple to the active regions (e.g., gate/source/drain) of the FEOL structures in the substrate 102. Networks of interconnect structures 110 (e.g., conductive lines, conductive wires, barrier layers, and the like) have been formed in a low-k interlevel dielectric (ILD) layer/region 108 as part of the BEOL structures formed during initial portions of the BEOL stage. The interconnect structures 110 can be copper (Cu), cobalt (Co), nickel (Ni), ruthenium (Ru) or any other suitable conductive material. The interconnect structures 110 can further include a barrier layer 112 between the metal fill of the interconnect structures 110 and the ILD layer 108. The barrier layer 112 can be titanium nitride (TiN), tantalum nitride (TaN), ruthenium (Ru), hafnium nitride (HfN), niobium nitride (NbN), tungsten nitride (WN), tungsten carbon nitride (WCN), or combinations thereof, where the barrier layer 112 can prevent diffusion and/or alloying of the metal contact fill material (used to form the interconnect structure 110) with a top source/drain material, and/or anode/cathode material. In embodiments of the invention, the barrier layer 112 can be deposited by ALD, CVD, MOCVD, PECVD, or combinations thereof. In embodiments of the invention, the metal fill of the interconnect structures 110 can be formed by ALD, CVD, and/or PVD.

In aspects of the invention, the ILD layer 108 can be formed from any suitable dielectric material such as a silicon oxide, low-k dielectric (e.g., k (relative dielectric constant) less than about 4), an ultra-low-k (ULK) dielectric (e.g., k less than about 2.5), tetraethoxysilane (TEOS), black diamond III (BDIII), and the like, or any suitable combination of those materials. The ILD 108 is formed over a cap layer 106. In one or more embodiments of the invention, the cap layer 106 can be any suitable insulating material such as, for example, silicon dioxide, silicon nitride, nitrogen doped silicon carbide (SiC), and the like. The cap layer 106 is formed over an oxide layer 104 formed over the substrate 102. The oxide layer 104 can be any suitable oxide material such as, for example, silicon oxide (SiO). The oxide layer 104 can have a conductive via 114 that connects the BEOL structures to the MOL and FEOL structures. In one or more embodiments of the invention, the multi-layered IC 100 includes a mask 120 formed over the logic region 101b which includes portions of the ILD layer 108 and top portions of the interconnect structures 110 in the logic region 101b. This mask 120 can sometimes be referred to as a sacrificial mask made from a sacrificial nitride such as, for example, a silicon nitride.

Figure 2:
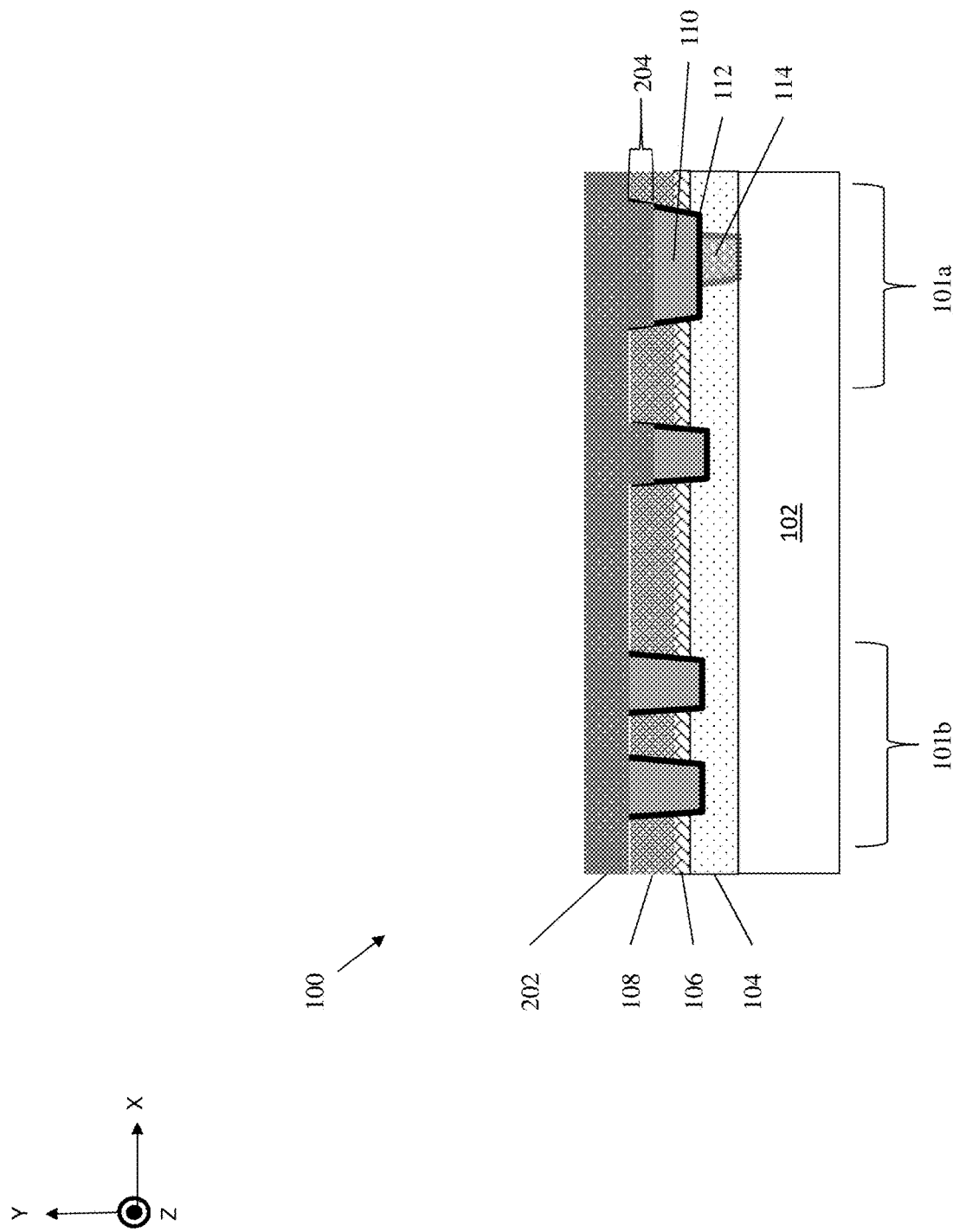

In FIG. 2, known semiconductor fabrication operations have been used to recess the uncovered interconnect structures 110 and portions of the barrier layer 112 in the memory regions 101a. The interconnect structures 110 and portions of the barrier layer 112 can be recessed using any suitable means including, but not limited to a wet etch, a dry etch, or a combination of sequential wet and/or dry etches. After the interconnect structures 110 and portions of the barrier layer 112 have been recessed, the mask (120 from FIG. 1) is removed utilizing any suitable means including, but not limited to a wet etch, a dry etch, or a combination of sequential wet and/or dry etches. A wet etch can include, for example a wet etch in hydrogen fluoride based chemistries. In one or more embodiments of the invention, after recessing the uncovered interconnect structures 110 and removal of the mask (120 from FIG. 1), a dielectric material cap layer 202 is deposited over the ILD layer 108 and the exposed tops of the interconnect structures 110. The recessed portions 204 of the interconnect structures 110 in the memory region 101a include the dielectric material cap 202 which is self-aligned in the recessed portions 204. The dielectric material cap 202 can be formed as a conformal layer, for example, by deposition of a dielectric material by CVD or ALD and etched back using any suitable method. Self-alignment of dielectric material cap 202 to recessed portions 204 prevents exposure of metal interconnect structure in the memory region 101a during MRAM pillar patterning process.

Figure 3:
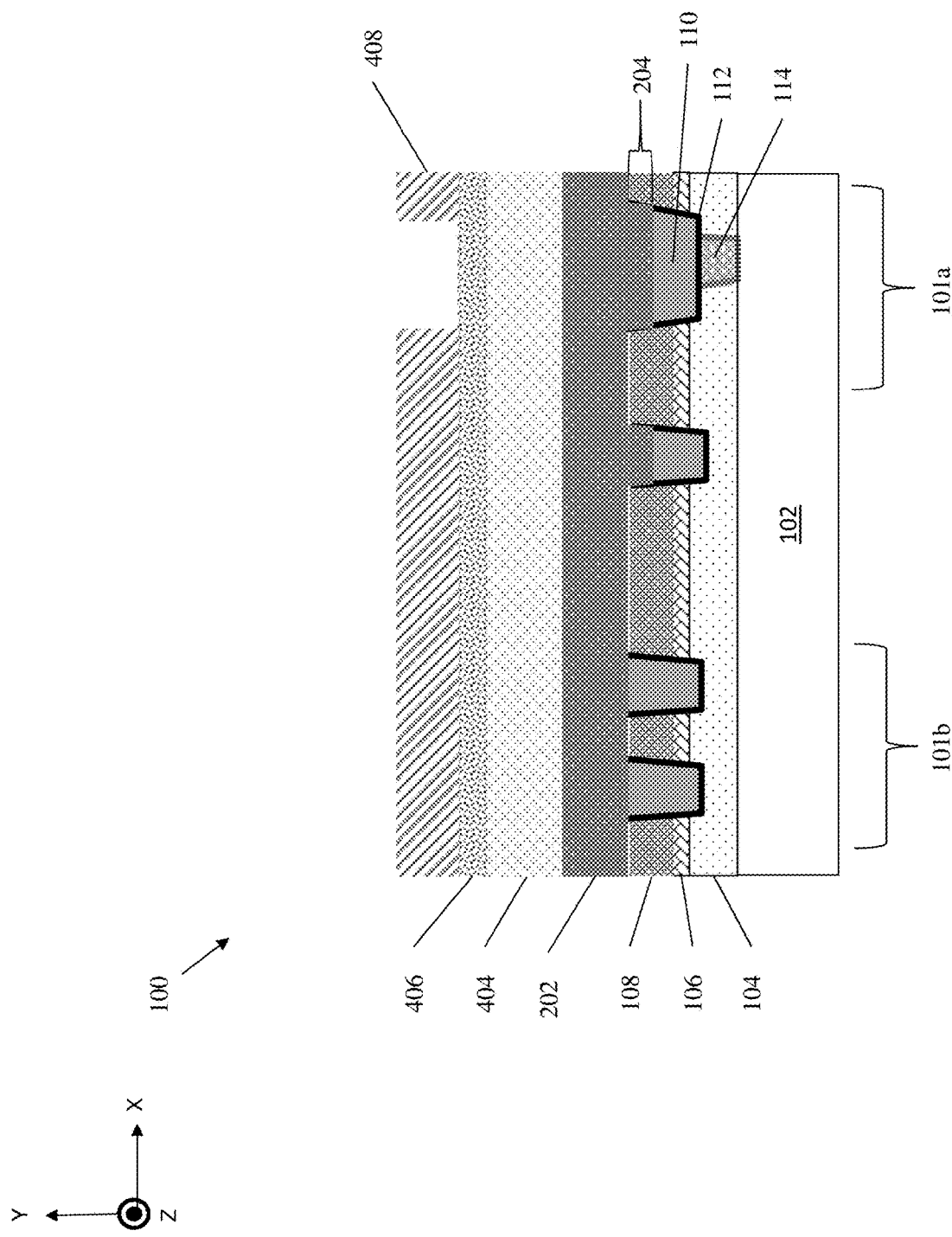

In FIG. 3, a tri-layer mask is formed over the dielectric material cap layers 202 in accordance with one or more embodiments of the present invention. The tri-layer mask includes an optical planarization layer (OPL) 404, an anti-reflection coating (ARC) layers 406, and a photoresist 408. The OPL 404 can be spun on and baked, or can be deposited by chemical vapor deposition (CVD). The ARC layer 406 can include Si ARC (SiARC), although other ARC layer materials can be employed. In one or more embodiments of the invention, the photoresist 408 is patterned on leaving an area above the interconnect structure 110 in the memory region 101a uncovered.

Figure 4:
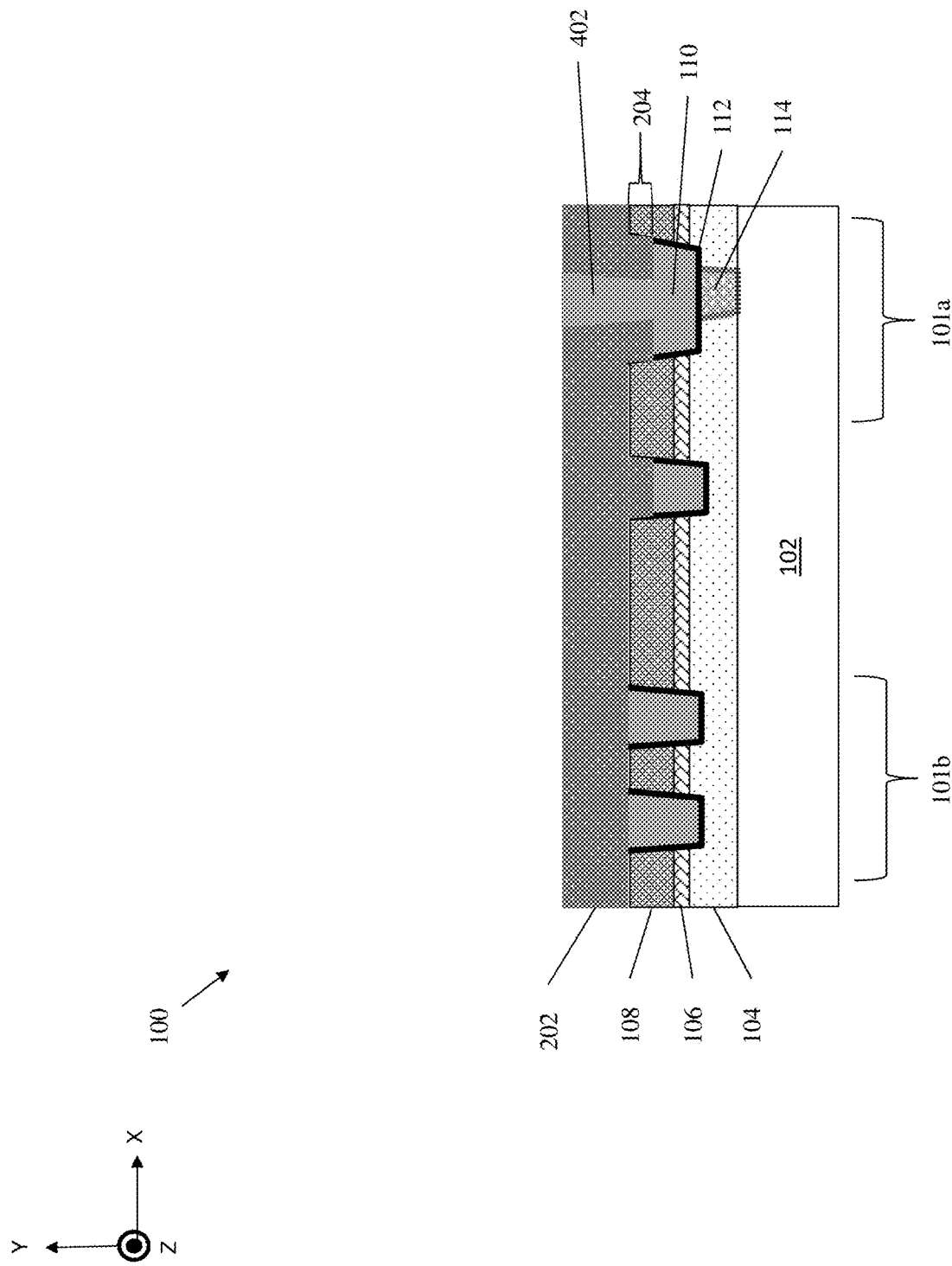

In FIG. 4, a bottom electrode contact etch and mask strip are performed on the multilayered IC 100 in accordance with one or more embodiments of the present invention. An etch process is utilized to etch into the uncovered portions of the tri-layer mask and the dielectric material cap 202 to expose a top portion of the interconnect structure 110 in the memory region 101a and to form a cavity in said portion of the dielectric material cap 202. A conductive material is deposited into the cavity formed in the dielectric material cap 202 forming a bottom electrode contact 402. The bottom electrode contact 402 can be copper (Cu), cobalt (Co), nickel (Ni), Ruthenium (Ru) or any other suitable conductive material. In embodiments of the invention, the conductive material fill can be formed by ALD, CVD, and/or PVD. Because the interconnect structures 110 in the memory region 101a of the multilayered IC 100 were recessed initially, the bottom electrode contact 402 can have a greater height than if the interconnect structures were not recessed. This allows more dielectric gouge margin during patterning of MTJ stack using IBE and prevents exposing any metal in the memory area during the process. The tri-layer mask (e.g., photoresist 408, ARC 406, and OPL 404) as well as any overburden from the deposition of the conductive material can be removed by planarization using, for example, a chemical-mechanical planarization (CMP) process.

Figure 5:
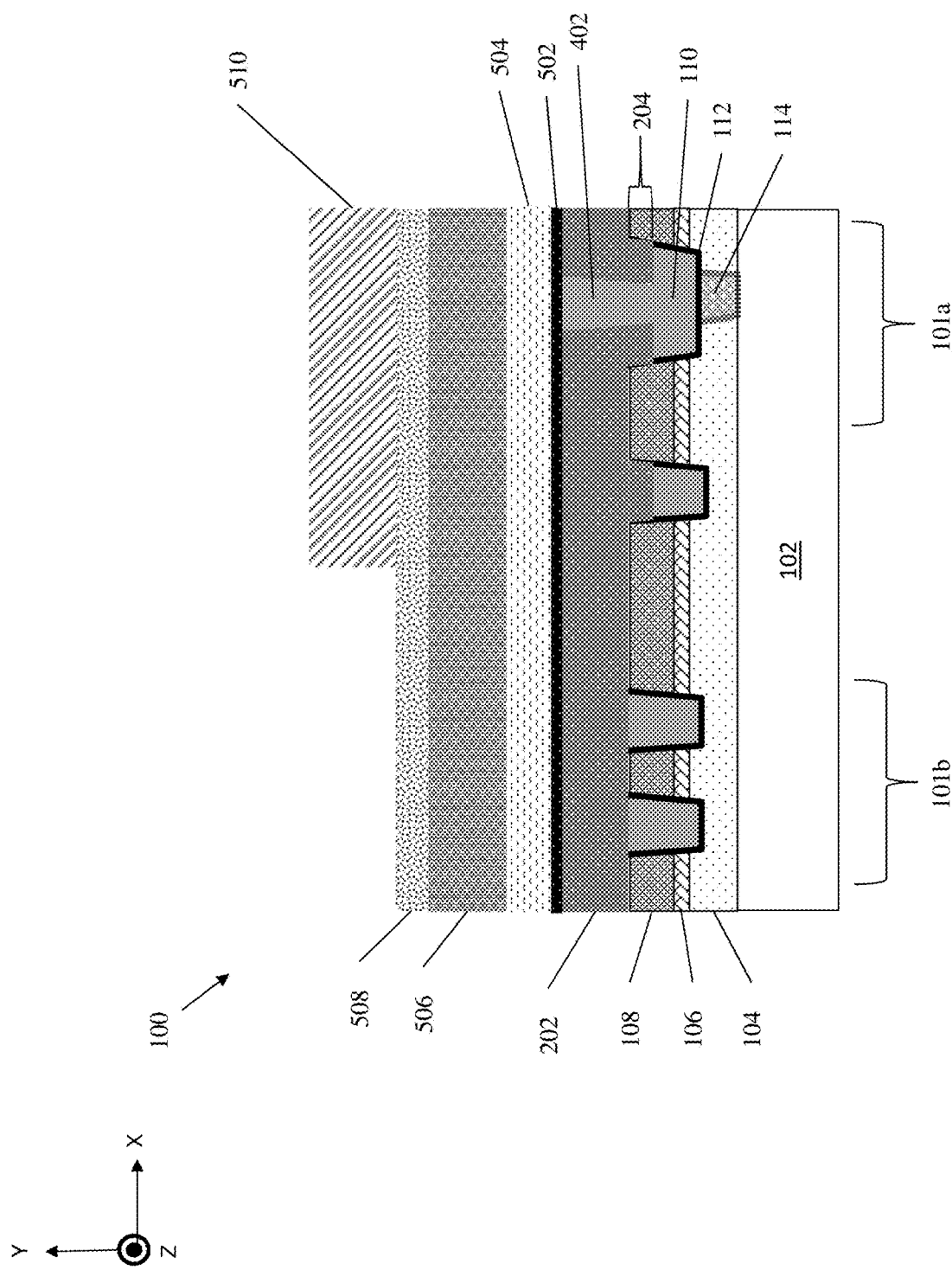

In FIG. 5, a metal cap layer 502, a sacrificial dielectric layer 504, and a second tri-level mask 506, 508, 510 are formed over the dielectric material cap 202 in accordance with one or more embodiments of the present invention. In one or more embodiments of the invention, the metal cap layer 502 is deposited over the dielectric material cap 202 and a top portion of the bottom electrode contact 402 using any suitable means such as, for example, by ALD, CVD, and/or PVD. The metal cap layer 502 can be any suitable material such as, for example, titanium nitride (TiN). A sacrificial dielectric layer 504 is deposited over the metal cap layer 502 using any suitable means such as, for example, CVD or ALD. The sacrificial dielectric layer 504 can be a nitride such as, for example, silicon nitride. A second tri-layer mask is formed over the sacrificial dielectric layer 504. The second tri-layer mask includes an OPL 506, an ARC 508, and a photoresist 510. In one or more embodiments of the invention, the photoresist 510 covers the memory region 101a of the multilayered IC 100 leaving the logic region 101b and associated layers uncovered. The OPL 506 can be spun on and baked, or can be deposited by chemical vapor deposition (CVD). The ARC layer 508 can include Si ARC (SiARC), although other ARC layer materials can be employed.

Figure 6:
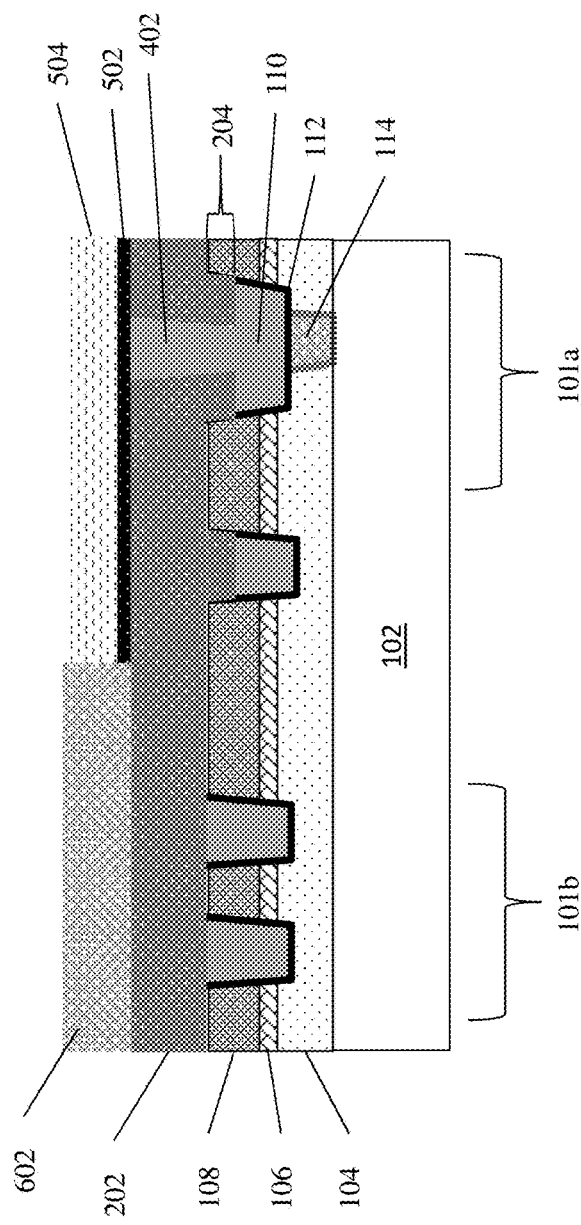

In FIG. 6, the uncovered layers in the logic region 101b are etched selective to the dielectric cap material 202, the remaining second tri-layer mask is removed, and a protective dielectric layer 602 is deposited over the dielectric material cap 202 in accordance with one or more embodiments of the invention. An etch process is utilized to etch into the uncovered portion (e.g., the logic region 101b not covered by the photoresist (510 from FIG. 5)) selective to the dielectric material cap 202. The etch process can be any suitable method such as a wet etch, a dry etch, or a combination of sequential wet and/or dry etches. The remaining portions of the second tri-layer mask can be removed using dry or wet etch process or a combination. That is to the say, the remaining layers (photoresist 510, OPL 506, ARC 508) in the memory region 101a are removed leaving exposed top portions of the dielectric material cap 202 in the logic region 101b and the sacrificial dielectric 504 and metal cap layer 502 in the memory region 101a. A protective dielectric layer 602 is deposited over the dielectric material cap 202 as well as the sacrificial dielectric 504. The protective dielectric layer 602 can be conformally deposited using PVD, CVD, PECVD or similar deposition process and a planarization process, for example, a chemical-mechanical planarization (CMP) process can remove excess protective dielectric layer 602 and level it with the sacrificial dielectric 504.

Figure 7:
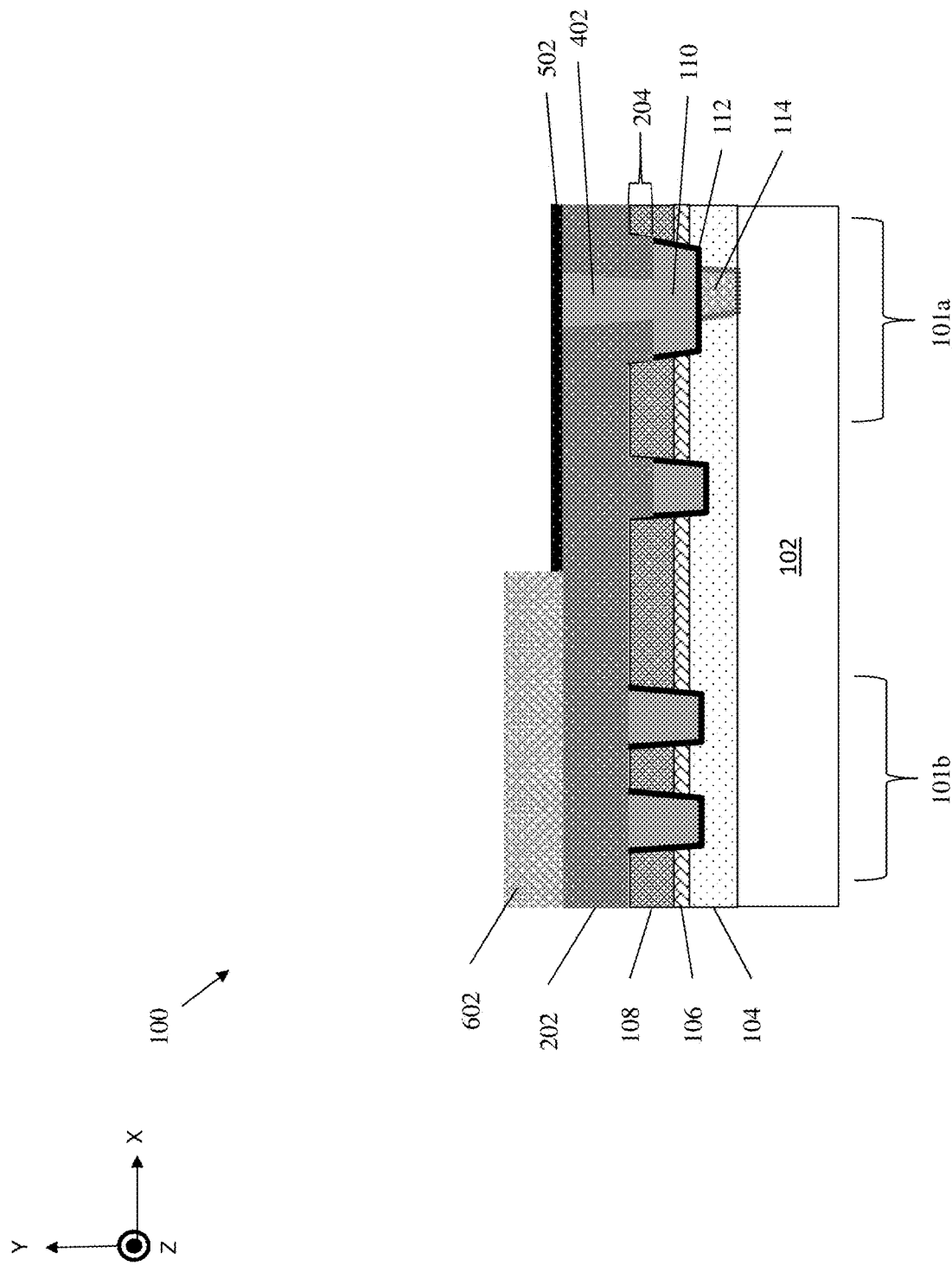
Figure 8:
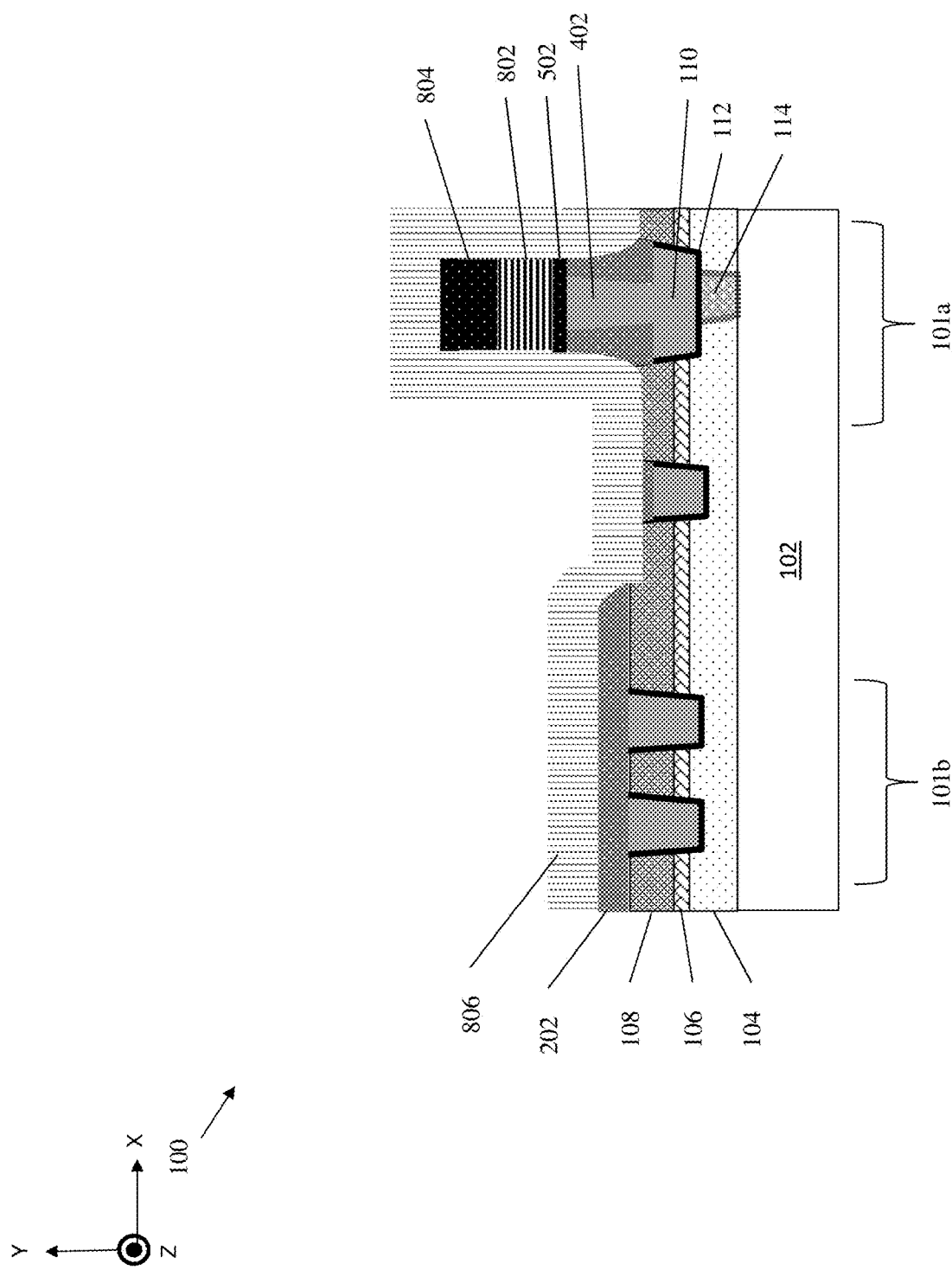
Figure 9:
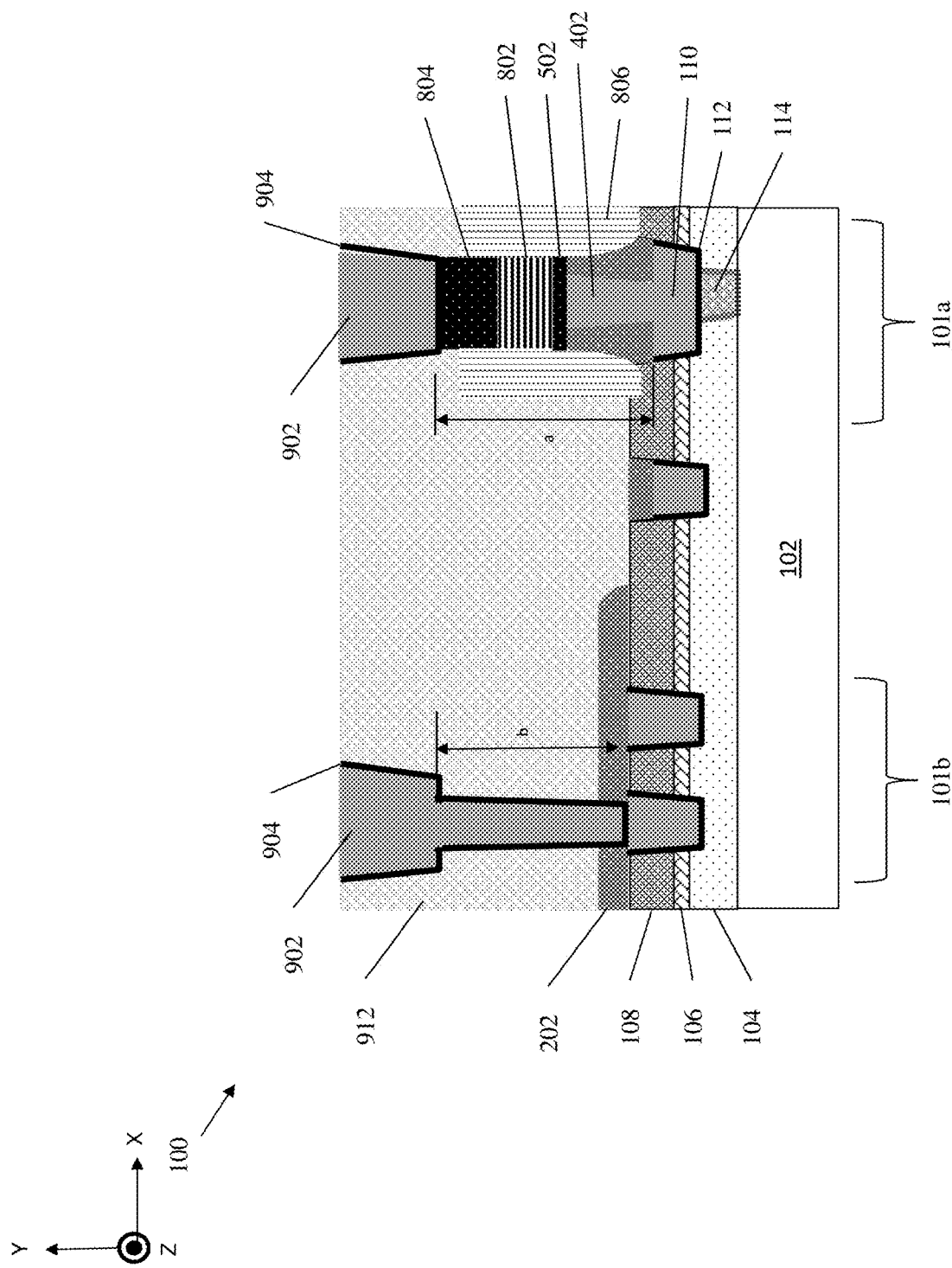
Figure 10:
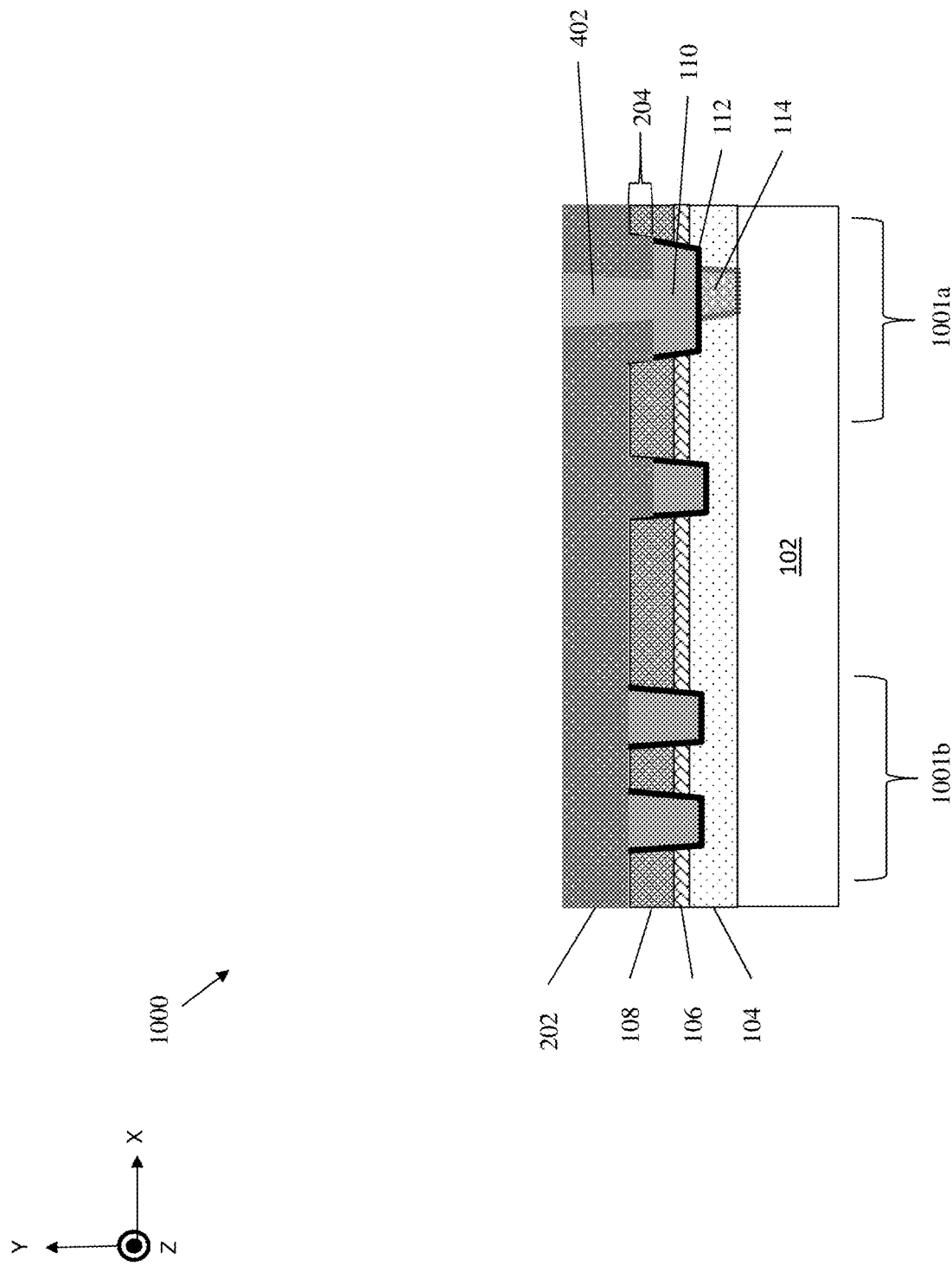

In FIG. 7, the sacrificial dielectric 504 is removed leaving the metal cap 502 over the memory region 101a and the protection dielectric 602 over the logic region 101b according to one or more embodiments of the invention. The sacrificial dielectric (504 from FIG. 5) can be removed using any suitable method such as a wet etch, a dry etch, or a combination of sequential wet and/or dry etches. A wet etch can include, for example a wet etch in hydrogen fluoride based chemistries. In one or more embodiments of the invention, the metal cap 502 remains to form bottom electrode and the protective dielectric layer 602 protects the interconnect structures 110 in the logic region 101b during a MRAM pillar formation in the memory region 101a using ion beam etching (IBE). This protective dielectric 602 is utilized when the IBE process occurs to protect the interconnect structures 110 in the logic region 101b from potential damage resulting in high resistance and other issues. In one or more embodiments of the invention, the protective dielectric 602 can be any suitable dielectric material including a nitride doped silicon carbide, a silicon nitride, aluminum oxide, hafnium oxide or any other high-k and moderate-k dielectric or combination. FIGS. 8-10 depict the formation of a MTJ memory element over the memory region 101a of the multilayer IC 100 according to embodiments of the invention.

In FIG. 8, known fabrication techniques are utilized to form an MRAM pillar and deposit a pillar encapsulation over the MRAM pillar and the remaining dielectric material cap 202 and interlayer dielectric 108 according to one or more embodiments. The MRAM pillar can be formed by depositing an MTJ stack layer 802, a top electrode 804 conductive material, a sacrificial nitride or oxide, along with a tri-level mask (OPL, ARC, and photoresist) where the photoresist covers the MRAM pillar. Photoresist is patterned using lithography to form pillars which are then transferred to top electrode 804 using RIE. Pillar pattern is then transfer to MTJ stack 802 and bottom electrode 502 using an etching operations such as, for example, an ion beam etch (IBE). A portion of the dielectric material cap 202 remains after the IBE protecting metal pad or lines 110 in the memory area 101a and interconnect structures in the logic area 101b from IBE gouging. In one or more embodiments, the critical dimension of bottom electrode contact 402 is smaller than that of bottom electrode contact to prevent exposure of bottom electrode contact metal during MTJ pillar patterning using IBE. This eliminates the possibility of any additional metal sputtering and redeposition on MTJ pillars after etching bottom electrode 502 and reduces risk of tunnel junction shorts.

The MTJ stack 802 includes a free layer and a fixed/reference layer, each of which includes a magnetic material. The free and reference layers are separated by a non-magnetic insulating tunnel barrier. The free layer and the reference layer are magnetically de-coupled by the tunnel barrier. The free layer has a variable magnetization direction, and the reference layer has an invariable magnetization direction. A wide variety of layers and elements (e.g., an MTJ cap, multiple free/reference layers, etc.) can be included in an MTJ stack 802. The MTJ stack 802 is deposited over the metal cap (now the bottom electrode) 502 using known fabrication operations.

In one or more embodiments of the invention, a pillar encapsulation material 806 can be conformally deposited over the dielectric material cap 202, portions of the ILD layer 108 and the MTJ pillar. The pillar encapsulation material 806 can be any suitable dielectric material including but not limited to silicon nitride.

In FIG. 9, known fabrication techniques are utilized to form top contacts in the memory region 101a and logic region 101b according to one or more embodiments of the invention. The pillar encapsulation material 806 can be removed to expose portions of the dielectric material cap 202 over the logic area 101b and to expose the top electrode 804 in the MRAM pillar. The pillar encapsulation material 806 can be removed using any suitable method such as a wet etch, a dry etch, or a combination of sequential wet and/or dry etches. A second interlayer dielectric (ILD) 912 layer can be deposited over the exposed portions of the dielectric material cap 202, the ILD layer 108, the pillar encapsulation material 806, and the MRAM pillar. Trenches can be formed in the ILD layer 912 to expose portions of the top electrode 804 in the memory area 101a and portions of the interconnect structures in the logic area. A liner layer 904 can be formed in the trenches followed by deposition of contacts 902. The contacts 902 can be formed of Cu, although other suitable materials including but not limited to Al, W, Co, Ru or another material specified by BEOL guidelines can be used. A resist, such as a photoresist along with tri-layer lithographic stack, can be deposited and patterned to form the trenches for the metal lines and contacts 902. A CM' can be utilized for removal of any overburden from the contacts deposition. The height 'a' of the MRAM pillar is larger than the height 'b' of the contact for the interconnect structures in the logic region 101b. This allows fitting a taller MRAM pillar in the memory region without increasing the contact height 'b' in the logic region 101b since increase in height 'b' increases the challenge of etching and filling contacts in logic area due to increase in contact aspect ratio.

FIG. 10 depicts an alternate embodiment of the invention where known fabrications techniques have been utilized to form a bottom electrode contact in a memory area of a multilayered integrated circuit according to one or more embodiments of the invention. FIG. 10 mirrors FIG. 4 wherein the processing steps described with reference to FIGS. 1-3 have been utilized to form the bottom electrode contact 402 in a memory area 101a of the multilayered integrated circuit 1000. For ease of illustration and description, similar numbering conventions will be utilized for layers of the multilayered IC 1000 that mirror the processing steps from FIGS. 1-3. The IC 1000 can include a substrate 102 with a memory area 101a and a logic area 101b. Networks of interconnect structures 110 (e.g., conductive lines, conductive wires, barrier layers, and the like) have been formed in a low-k interlevel dielectric (ILD) layer/region 108 as part of the BEOL structures formed during initial portions of the BEOL stage. The interconnect structures 110 can be copper (Cu), cobalt (Co), nickel (Ni), Ruthenium (Ru) or any other suitable conductive material. The interconnect structures 110 can further include a barrier layer 112 between the metal fill of the interconnect structures 110 and the ILD layer 108. The barrier layer 112 can be titanium nitride (TiN), tantalum nitride (TaN), ruthenium (Ru), hafnium nitride (HfN), niobium nitride (NbN), tungsten nitride (WN), tungsten carbon nitride (WCN), or combinations thereof, where the barrier layer 112 can prevent diffusion and/or alloying of the metal contact fill material (used to form the interconnect structure 110) with a top source/drain material, and/or anode/cathode material. In embodiments of the invention, the barrier layer 112 can be deposited by ALD, CVD, MOCVD, PECVD, or combinations thereof. In embodiments of the invention, the metal fill of the interconnect structures 110 can be formed by ALD, CVD, electroplating and/or PVD. In aspects of the invention, the ILD layer 108 can be formed from any suitable dielectric material such as a silicon oxide, low-k dielectric (e.g., k (relative dielectric constant) less than about 4), an ultra-low-k (ULK) dielectric (e.g., k less than about 2.5), tetraethoxysilane (TEOS), black diamond III (BDIII), and the like, or any suitable combination of those materials. The ILD 108 is formed over a cap layer 106. In one or more embodiments of the invention, the cap layer 106 can be any suitable insulating material such as, for example, silicon dioxide, silicon nitride, nitrogen doped silicon carbide (SiC), and the like. The cap layer 106 is formed over an oxide layer 104 formed over the substrate 102. The oxide layer 104 can be any suitable oxide material such as, for example, silicon oxide (SiO2). The oxide layer 104 can have a conductive via 114 that connects the BEOL structures to the MOL and FEOL structures.

In some embodiments of the invention, the interconnect structures 110 and portions of the barrier layer 112 can be recessed using any suitable means including, but not limited to a wet etch, a dry etch, or a combination of sequential wet and/or dry etches. A mask can be utilized to cover the logic region 101b during etching of the interconnect structures. After the interconnect structures 110 and portions of the barrier layer 112 have been recessed. In one or more embodiments of the invention, after recessing the uncovered interconnect structures 110 and removal of the mask, a dielectric material cap layer 202 is deposited over the ILD layer 108 and the exposed tops of the interconnect structures 110. The recessed portions 204 of the interconnect structures 110 in the memory region 101a include the dielectric material cap 202 which is self-aligned in the recessed portions 204. The dielectric material cap 202 can be formed as a conformal layer, for example, by deposition of a dielectric material by CVD or ALD and etched back using any suitable method.

In some embodiments of the invention, a tri-layer mask is formed over the dielectric material cap layers 202 in accordance with one or more embodiments of the present invention. The tri-layer mask includes an optical planarization layer (OPL) 404, an antireflection coating (ARC) layers 406, and a photoresist 408. The OPL 404 can be spun on and baked, or can be deposited by chemical vapor deposition (CVD). The ARC layer 406 can include Si ARC (SiARC), although other ARC layer materials can be employed. In one or more embodiments of the invention, the photoresist 408 is patterned on leaving an area above the interconnect structure 110 in the memory region 101a uncovered.

Figure 11:
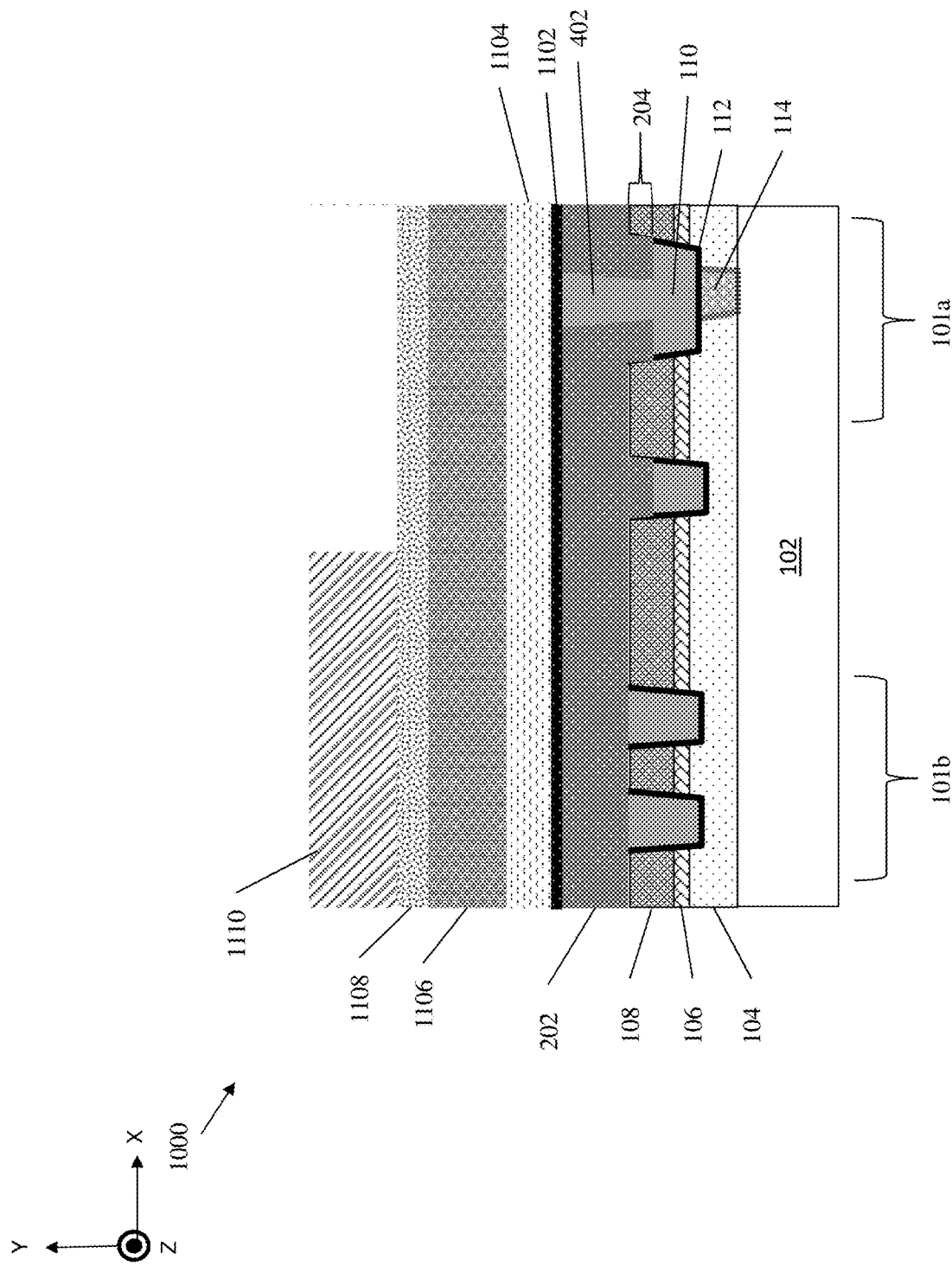

In FIG. 11, known semiconductor fabrication operations have been used to form a metal cap layer, sacrificial dielectric layer, and a tri-level mask over the dielectric material cap 202 in accordance with one or more embodiments of the present invention. FIG. 11 mirrors FIG. 5 except for the location of the photoresist 1110 being over the logic area 101b. According to one or more embodiments of the invention, a metal cap layers 1102 is deposited over the dielectric material cap 202 and a top portion of the bottom electrode contact 402 using any suitable means such as, for example, by ALD, CVD, and/or PVD. The metal cap layer 1102 can be any suitable material such as, for example, titanium nitride (TiN). A sacrificial dielectric layer 1104 is deposited over the metal cap layer 1102 using any suitable means such as, for example, CVD or ALD. The sacrificial dielectric layer 1104 can be a nitride such as, for example, silicon nitride. A second tri-layer mask is formed over the sacrificial dielectric layer 1104. The second tri-layer mask includes an OPL 1106, an ARC 1108, and a photoresist 1110. In one or more embodiments of the invention, the photoresist 1110 covers the logic region 101b of the multilayers IC 1000 leaving the memory region 101a and associated layers uncovered. The OPL 1106 can be spun on and baked, or can be deposited by chemical vapor deposition (CVD). The ARC layer 1108 can include Si ARC (SiARC), although other ARC layer materials can be employed.

Figure 12:
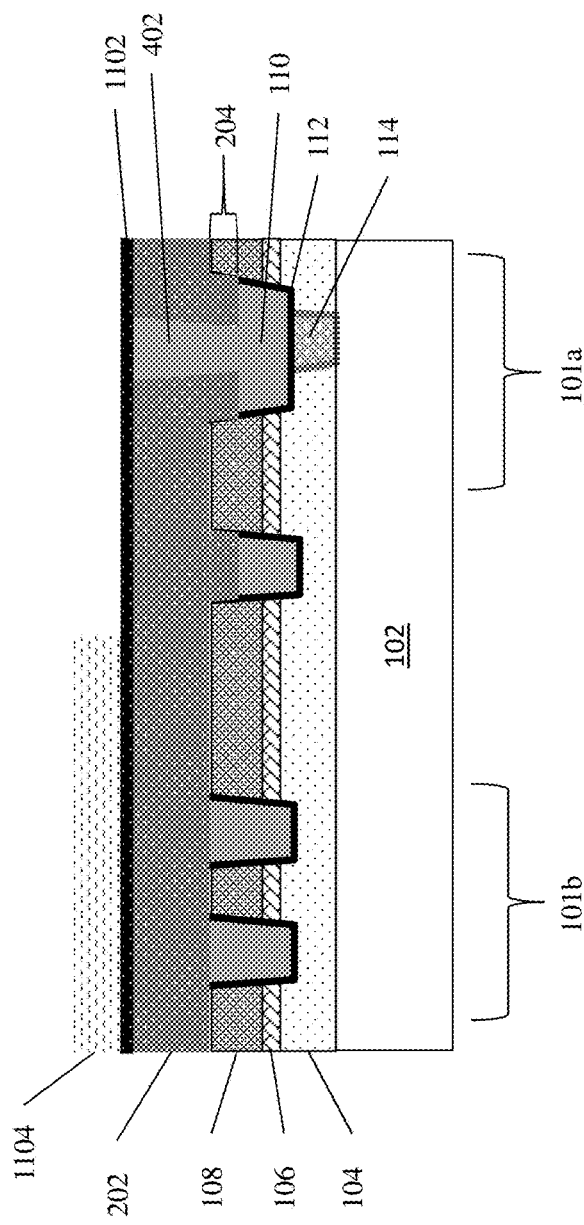

In FIG. 12, the uncovered layers in the memory region are etched selective to the metal cap layer 1102, the remaining tri-layer mask is removed except for the covered portions of the sacrificial dielectric layer 1104 over the logic area according to one or more embodiments of the invention. An etch process is utilized to etch into the uncovered portion (e.g., the memory region 101a not covered by the photoresist (1110 from FIG. 10)) selective to the metal cap layer 1102. The etch process can be any suitable method such as a wet etch, a dry etch, or a combination of sequential wet and/or dry etches. The remaining portions of the second tri-layer mask can be removed by using dry or wet etch process or a combination. That is to say, the remaining layers (photoresist 1110, OPL 1106, ARC 1108) in the logic region 101b are removed leaving exposed top portions of the sacrificial dielectric layer 1104 in the logic region 101b and the metal cap layer 1102 in the memory region 101a. This removes the step of forming a protective dielectric layer (602 from FIG. 6) on the multilayer IC 100 as shown in FIGS. 5-6. That is to say that the sacrificial dielectric layer 1104 and metal cap 1102 can now serve as a protective layer for the logic area 101*b* during MRAM pillar patterning utilizing IBE.

Figure 13:
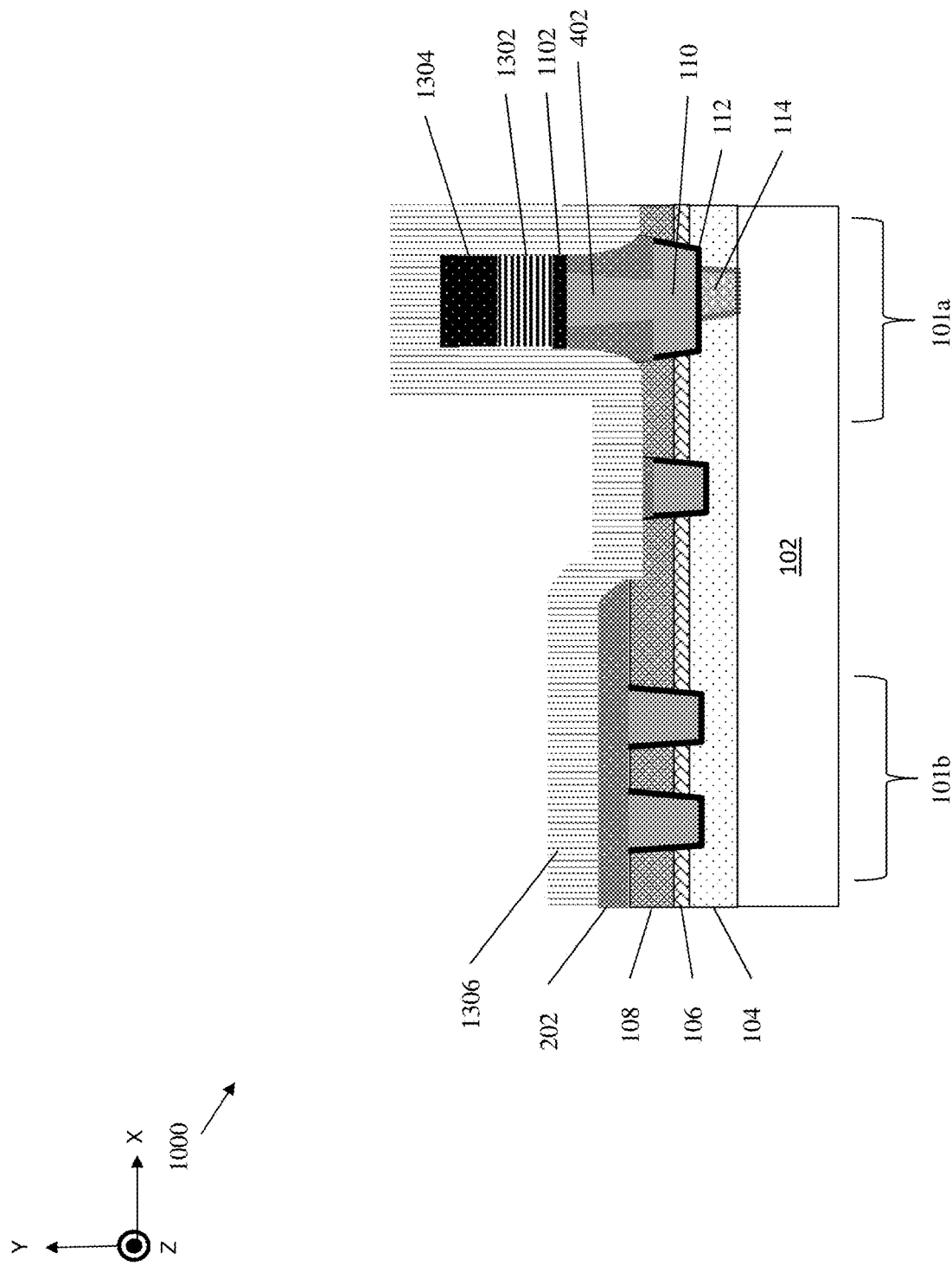

In FIG. 13, known fabrication techniques are utilized to form an MRAM pillar and deposit a pillar encapsulation over the MRAM pillar and the remaining dielectric material cap 202 and interlayer dielectric 108 according to one or more embodiments. The MRAM pillar can be formed by depositing an MTJ stack layer 1302, a top electrode 1304 conductive material, a sacrificial nitride or oxide, along with a tri-level mask (OPL, ARC, and photoresist) where the photoresist covers the MRAM pillar. Photoresist is patterned using lithography to form pillars which are then transferred to top electrode 1304 using RIE. Pillar pattern is then transfer to MTJ stack 1302 and bottom electrode 1102 (formed from the metal cap layer) using an etching operations such as, for example, an ion beam etch (IBE). A portion of the dielectric material cap 202 remains after the IBE protecting interconnect structures in the logic area 101*b* from IBE gouging. In some embodiments of the invention, a reactive ion etching (ME) process can be utilized in place of the IBE process.

The MTJ stack 1302 includes a free layer and a fixed/reference layer, each of which includes a magnetic material. The free and reference layers are separated by a non-magnetic insulating tunnel barrier. The free layer and the reference layer are magnetically de-coupled by the tunnel barrier. The free layer has a variable magnetization direction, and the reference layer has an invariable magnetization direction. A wide variety of layers and elements (e.g., an MTJ cap, multiple free/reference layers, etc.) can be included in an MTJ stack 1302. The MTJ stack 1302 is deposited over the bottom electrode (formerly the metal cap layer) 1102 using known fabrication operations.

In one or more embodiments of the invention, a pillar encapsulation material 1306 can be conformally deposited over the dielectric material cap 202, portions of the ILD layer 108 and the MTJ pillar. The pillar encapsulation material 1306 can be any suitable material including but not limited to silicon nitride.

Figure 14:
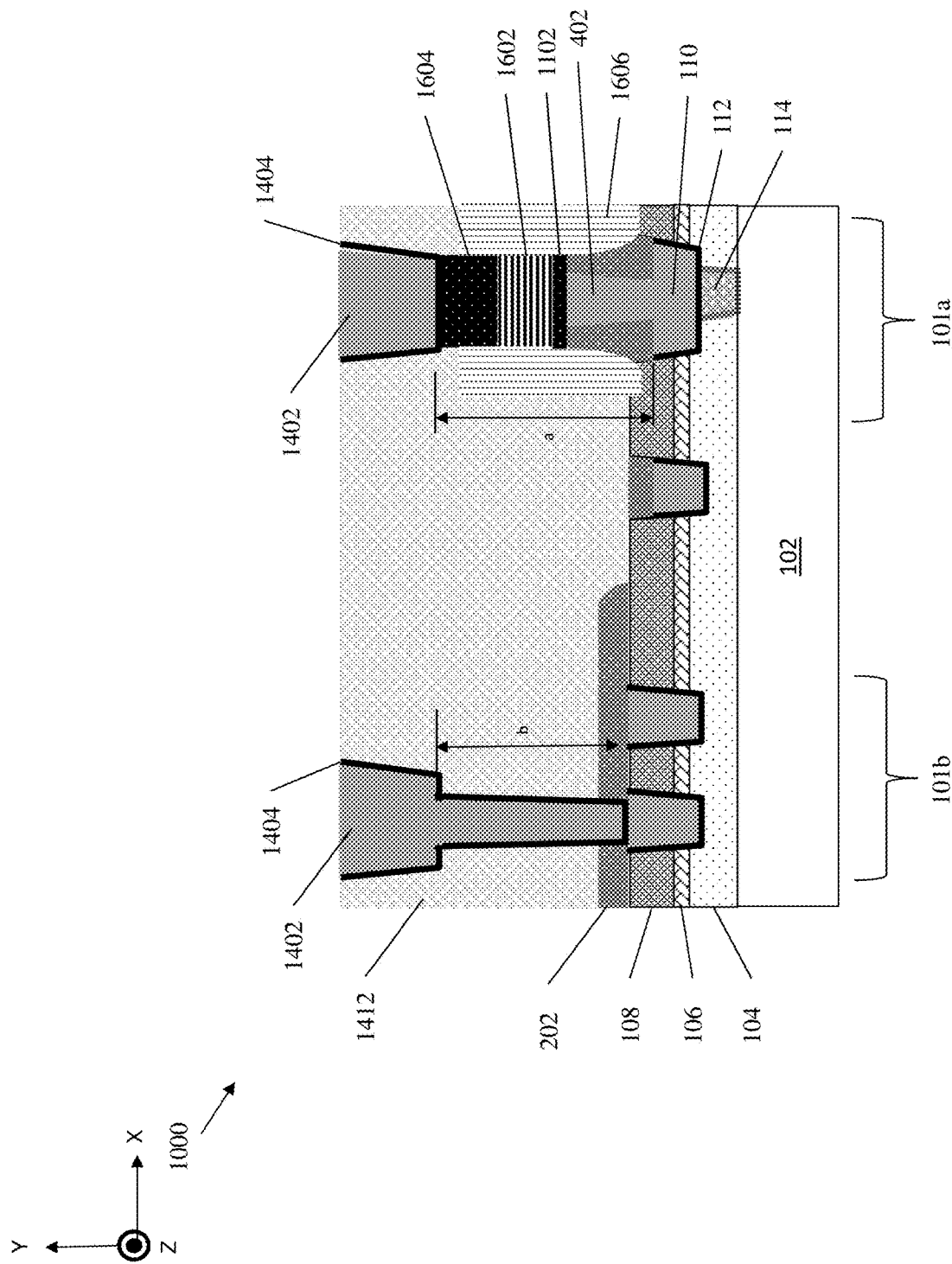

In FIG. 14, known fabrication techniques are utilized to form top contacts in the memory region and logic region according to one or more embodiments of the invention. The pillar encapsulation material 1306 can be removed to expose portions of the dielectric material cap 202 over the logic area 101*b* and to expose the top electrode 1304 in the MRAM pillar. The pillar encapsulation material 1306 can be removed using any suitable method such as a wet etch, a dry etch, or a combination of sequential wet and/or dry etches. A second interlayer dielectric (ILD) 1412 layer can be deposited over the exposed portions of the dielectric material cap 202, the ILD layer 108, the pillar encapsulation material 1306, and the MRAM pillar. Trenches can be formed in the ILD layer 1412 to expose portions of the top electrode 1304 in the memory area 101*a* and portions of the interconnect structures in the logic area. A liner layer 1404 can be formed in the trenches followed by deposition of contacts 1402. The contacts 1402 can be formed of Cu, although other suitable materials including but not limited to Al, Ru, Co, W or another material specified by BEOL guidelines can be used. A resist, such as a photoresist, along with tri-layer lithographic stack, can be deposited and patterned to form the trenches for the metal lines and contacts 1402. A CM' can be utilized for removal of any overburden from the contacts deposition. The height 'a' of the MRAM pillar is larger than the height 'b' of the contact for the interconnect structures in the logic region 101*b*. In some embodiments of the invention, the height 'a' of the MRAM pillar can be 50% greater height than the height 'b'.

Figure 15:
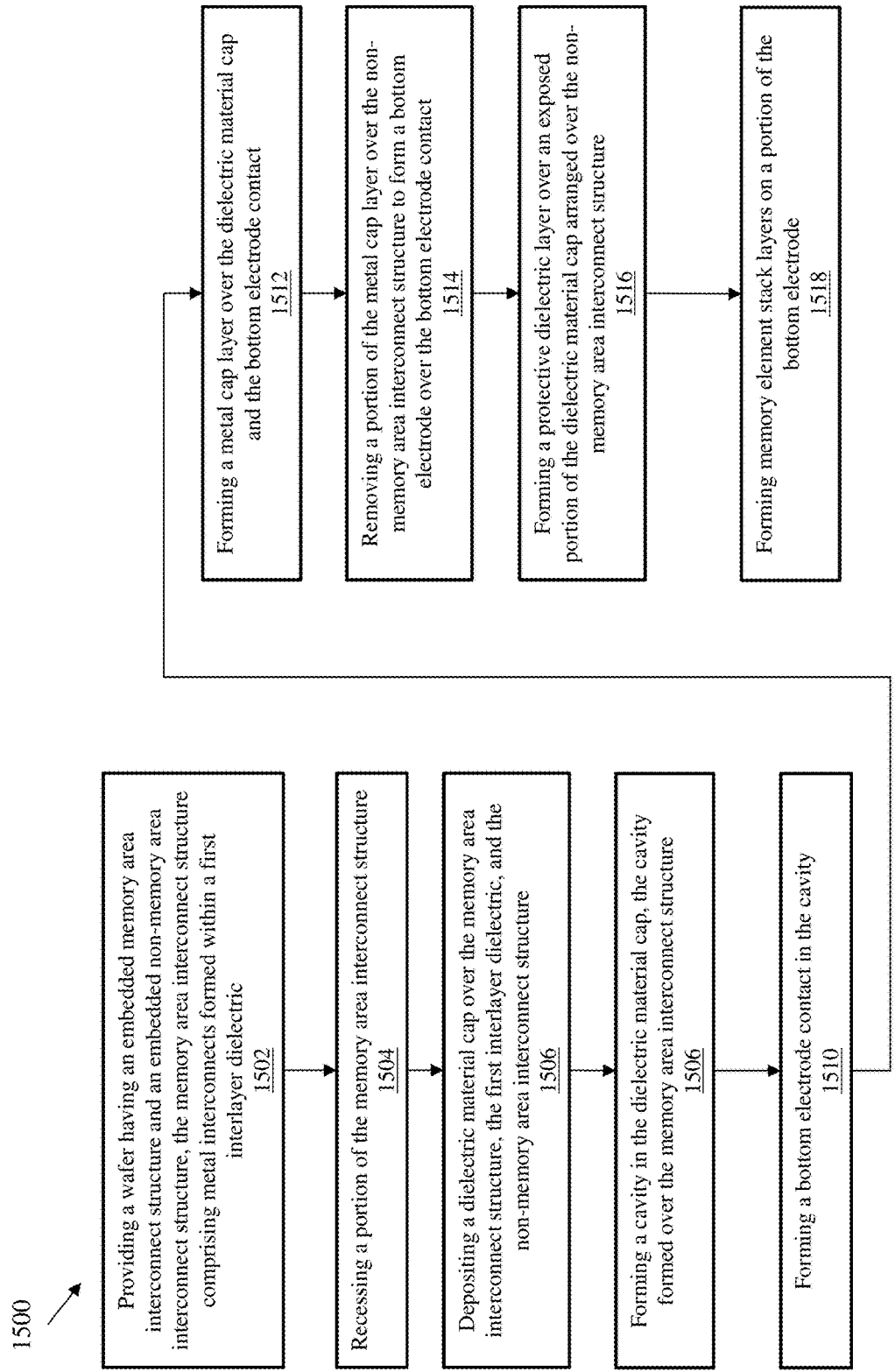
FIG. 15 depicts a flow diagram illustrating a method according to one or more embodiments of the invention.

FIG. 15 depicts a flow diagram of a method for fabricating an integrated circuit according to one or more embodiments of the invention. The method 1500 includes providing a wafer having an embedded memory area interconnect structure and an embedded non-memory area interconnect structure, the memory area interconnect structure including metal interconnects formed within a first interlayer dielectric, as shown in block 1502. The non-memory interconnect structures can be utilized for a logic area of the wafer. At block 1504, the method 1500 includes recessing a portion of the memory area interconnect structure. The recessing of the memory area interconnect structure adds to the height of the bottom electrode contact and the total height for an MRAM pillar. The method 1500, at block 1506, includes depositing a dielectric material cap over the memory area interconnect structure, the first interlayer dielectric, and the non-memory area interconnect structure. The dielectric material cap is self-aligned in the recessed portion of the memory area interconnect structure. The method 1500 then includes forming a cavity in the dielectric material cap, the cavity formed over the memory area interconnect structure, as shown in block 1508. The method 1500 also includes forming a bottom electrode contact in the cavity, as shown in block 1510. And at block 1512, the method 1500 includes forming a metal cap layer over the dielectric material cap and the bottom electrode contact. At block 1514, the method 1500 includes removing a portion of the metal cap layer over the non-memory area interconnect structure to form a bottom electrode over the bottom electrode contact. So the metal cap layer remains over the memory area interconnect structure as the bottom electrode. The method 1500, at block 1516, includes forming a protective dielectric layer over an exposed portion of the dielectric material cap arranged over the non-memory area interconnect structure. This protective dielectric layer is utilized to protect the non-memory area interconnect structure during formation of the memory element stack layers over the bottom electrode contact. This extra protective dielectric layer can absorb the IBE used for forming the memory element stack layers and protect from IBE gouging. And at block 1518, the method 1500 includes forming memory element stack layers on a portion of the metal cap (i.e., bottom electrode) layer over the bottom electrode contact.

Additional processes can also be included. It should be understood that the processes depicted in FIG. 15 represent illustrations, and that other processes can be added or existing processes can be removed, modified, or rearranged without departing from the scope and spirit of the present invention.

Figure 16:
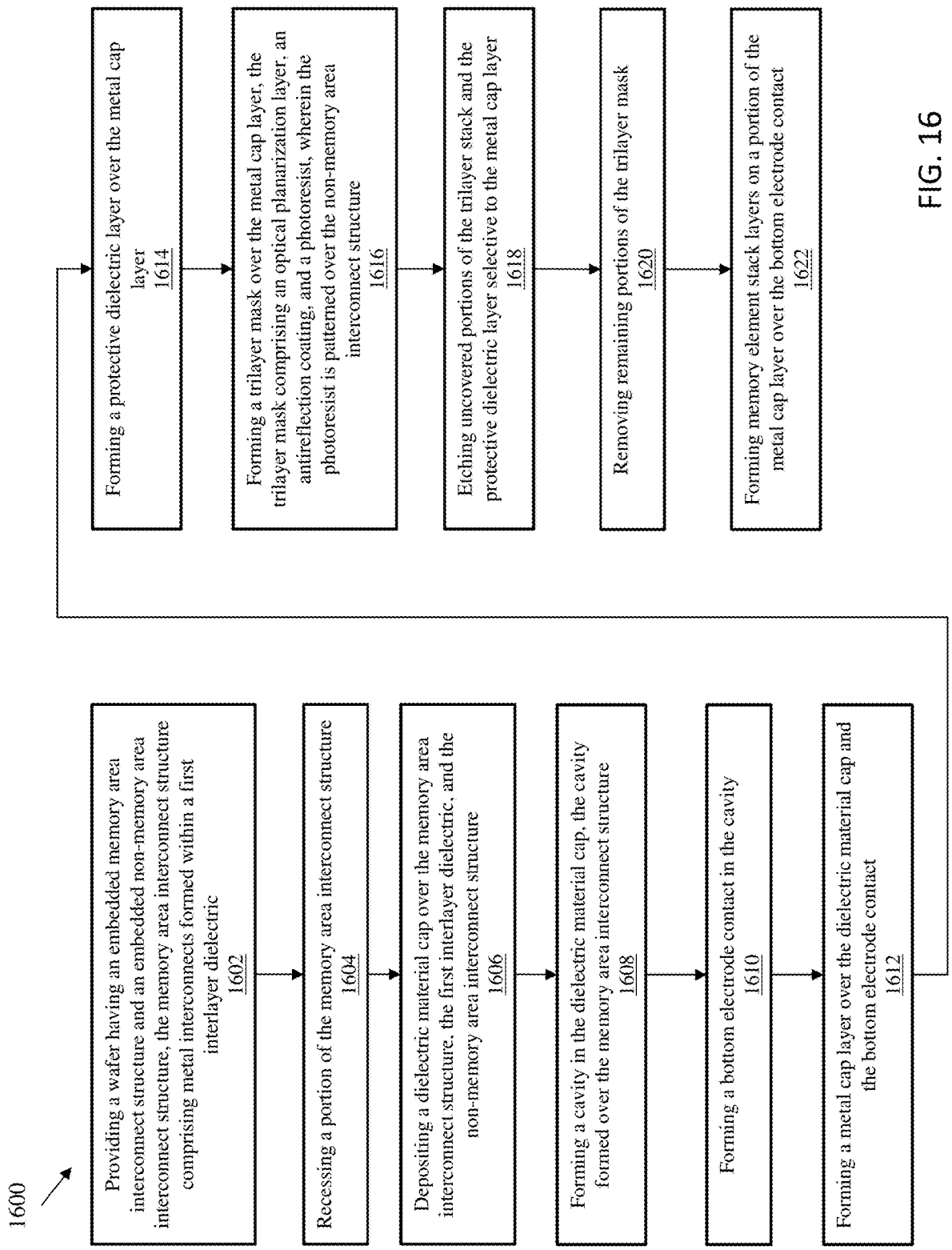
FIG. 16 depicts a flow diagram illustrating a method according to one or more embodiments of the invention.

FIG. 16 depicts a flow diagram of a method for fabricating an integrated circuit according to one or more embodiments of the invention. The method 1600 includes providing a wafer having an embedded memory area interconnect structure and an embedded non-memory area interconnect structure, the memory area interconnect structure including metal interconnects formed within a first interlayer dielectric, as shown in block 1602. The non-memory interconnect structures can be utilized for a logic area of the wafer. At block 1604, the method 1600 includes recessing a portion of the memory area interconnect structure. The recessing of the memory area interconnect structure adds to the height of the bottom electrode and the total height for an MRAM pillar. The method 1600, at block 1606, includes depositing a dielectric material cap over the memory area interconnect structure, the first interlayer dielectric, and the non-memory area interconnect structure. The dielectric material cap is self-aligned in the recessed portion of the memory area interconnect structure. The method 1600 then includes forming a cavity in the dielectric material cap, the cavity formed over the memory area interconnect structure, as shown in block 1608. The method 1600 also includes forming a bottom electrode contact in the cavity, as shown in block 1610. And at block 1612, the method 1600 includes forming a metal cap layer over the dielectric material cap and the bottom electrode contact. The metal cap layer in the memory region forms the bottom electrode during memory stack patterning. At block 1614, the method 1600 includes forming a protective dielectric layer over the metal cap layer. Here, the protective dielectric layer is formed over the metal cap layer instead of removing the metal cap layer over the non-memory area interconnect structure. At block 1616, the method 1600 includes forming a trilayer mask over the metal cap layer, the trilayer mask including an optical planarization layer, an antireflection coating, and a photoresist, wherein the photoresist is patterned over the non-memory area interconnect structure. Also, the method 1600 includes etching uncovered portions of the trilayer stack and the protective dielectric layer selective to the metal cap layer, as shown in block 1618. The method 1600, at block 1620, includes removing remaining portions of the trilayer mask. And at block 1622, the method 1600 includes forming memory element stack layers on a portion of the metal cap layer (i.e., bottom electrode) over the bottom electrode contact.

Additional processes can also be included. It should be understood that the processes depicted in FIG. 16 represent illustrations, and that other processes can be added or existing processes can be removed, modified, or rearranged without departing from the scope and spirit of the present invention.

Various embodiments of the present invention are described herein with reference to the related drawings. Alternative embodiments can be devised without departing from the scope of this invention. Although various connections and positional relationships (e.g., over, below, adjacent, etc.) are set forth between elements in the following description and in the drawings, persons skilled in the art will recognize that many of the positional relationships described herein are orientation-independent when the described functionality is maintained even though the orientation is changed. These connections and/or positional relationships, unless specified otherwise, can be direct or indirect, and the present invention is not intended to be limiting in this respect. Accordingly, a coupling of entities can refer to either a direct or an indirect coupling, and a positional relationship between entities can be a direct or indirect positional relationship. As an example of an indirect positional relationship, references in the present description to forming layer "A" over layer "B" include situations in which one or more intermediate layers (e.g., layer "C") is between layer "A" and layer "B" as long as the relevant characteristics and functionalities of layer "A" and layer "B" are not substantially changed by the intermediate layer(s).

The following definitions and abbreviations are to be used for the interpretation of the claims and the specification. As used herein, the terms "comprises," "comprising," "includes," "including," "has," "having," "contains" or "containing," or any other variation thereof, are intended to cover a non-exclusive inclusion. For example, a composition, a mixture, process, method, article, or apparatus that comprises a list of elements is not necessarily limited to only those elements but can include other elements not expressly listed or inherent to such composition, mixture, process, method, article, or apparatus.

Additionally, the term "exemplary" is used herein to mean "serving as an example, instance or illustration." Any embodiment or design described herein as "exemplary" is not necessarily to be construed as preferred or advantageous over other embodiments or designs. The terms "at least one" and "one or more" are understood to include any integer number greater than or equal to one, i.e. one, two, three, four, etc. The terms "a plurality" are understood to include any integer number greater than or equal to two, i.e. two, three, four, five, etc. The term "connection" can include an indirect "connection" and a direct "connection."

References in the specification to "one embodiment," "an embodiment," "an example embodiment," etc., indicate that the embodiment described can include a particular feature, structure, or characteristic, but every embodiment may or may not include the particular feature, structure, or characteristic. Moreover, such phrases are not necessarily referring to the same embodiment. Further, when a particular feature, structure, or characteristic is described in connection with an embodiment, it is submitted that it is within the knowledge of one skilled in the art to affect such feature, structure, or characteristic in connection with other embodiments whether or not explicitly described.

For purposes of the description hereinafter, the terms "upper," "lower," "right," "left," "vertical," "horizontal," "top," "bottom," and derivatives thereof shall relate to the described structures and methods, as oriented in the drawing figures. The terms "overlying," "atop," "on top," "positioned on" or "positioned atop" mean that a first element, such as a first structure, is present on a second element, such as a second structure, wherein intervening elements such as an interface structure can be present between the first element and the second element. The term "direct contact" means that a first element, such as a first structure, and a second element, such as a second structure, are connected without any intermediary conducting, insulating or semiconductor layers at the interface of the two elements.

Spatially relative terms, e.g., "beneath," "below," "lower," "above," "upper," and the like, can be used herein for ease of description to describe one element or feature's relationship to another element(s) or feature(s) as illustrated in the figures. It will be understood that the spatially relative terms are intended to encompass different orientations of the device in use or operation in addition to the orientation depicted in the figures. For example, if the device in the figures is turned over, elements described as "below" or "beneath" other elements or features would then be oriented "above" the other elements or features. Thus, the term "below" can encompass both an orientation of above and below. The device can be otherwise oriented (rotated 90 degrees or at other orientations) and the spatially relative descriptors used herein interpreted accordingly.

The phrase "selective to," such as, for example, "a first element selective to a second element," means that the first element can be etched and the second element can act as an etch stop.

The terms "about," "substantially," "approximately," and variations thereof, are intended to include the degree of error associated with measurement of the particular quantity based upon the equipment available at the time of filing the application. For example, "about" can include a range of ±8% or 5%, or 2% of a given value.

As previously noted herein, for the sake of brevity, conventional techniques related to semiconductor device and integrated circuit (IC) fabrication may or may not be described in detail herein. By way of background, however, a more general description of the semiconductor device fabrication processes that can be utilized in implementing one or more embodiments of the present invention will now be provided. Although specific fabrication operations used in implementing one or more embodiments of the present invention can be individually known, the described combination of operations and/or resulting structures of the present invention are unique. Thus, the unique combination of the operations described in connection with the fabrication of a semiconductor device according to the present invention utilize a variety of individually known physical and chemical processes performed on a semiconductor (e.g., silicon) substrate, some of which are described in the immediately following paragraphs.

In general, the various processes used to form a microchip that will be packaged into an IC fall into four general categories, namely, film deposition, removal/etching, semiconductor doping and patterning/lithography. Deposition is any process that grows, coats, or otherwise transfers a material onto the wafer. Available technologies include physical vapor deposition (PVD), chemical vapor deposition (CVD), electrochemical deposition (ECD), molecular beam epitaxy (MBE) and more recently, atomic layer deposition (ALD) among others. Removal/etching is any process that removes material from the wafer. Examples include etch processes (either wet or dry), and chemical-mechanical planarization (CMP), and the like. Semiconductor doping is the modification of electrical properties by doping, for example, transistor sources and drains, generally by diffusion and/or by ion implantation. These doping processes are followed by furnace annealing or by rapid thermal annealing (RTA). Annealing serves to activate the implanted dopants. Films of both conductors (e.g., poly-silicon, aluminum, copper, etc.) and insulators (e.g., various forms of silicon dioxide, silicon nitride, etc.) are used to connect and isolate transistors and their components. Selective doping of various regions of the semiconductor substrate allows the conductivity of the substrate to be changed with the application of voltage. By creating structures of these various components, millions of transistors can be built and wired together to form the complex circuitry of a modern microelectronic device. Semiconductor lithography is the formation of three-dimensional relief images or patterns on the semiconductor substrate for subsequent transfer of the pattern to the substrate. In semiconductor lithography, the patterns are formed by a light sensitive polymer called a photo-resist. To build the complex structures that make up a transistor and the many wires that connect the millions of transistors of a circuit, lithography and etch pattern transfer steps are repeated multiple times. Each pattern being printed on the wafer is aligned to the previously formed patterns and slowly the conductors, insulators and selectively doped regions are built up to form the final device.

The flowchart and block diagrams in the Figures illustrate possible implementations of fabrication and/or operation methods according to various embodiments of the present invention. Various functions/operations of the method are represented in the flow diagram by blocks. In some alternative implementations, the functions noted in the blocks can occur out of the order noted in the Figures. For example, two blocks shown in succession can, in fact, be executed substantially concurrently, or the blocks can sometimes be executed in the reverse order, depending upon the functionality involved.

The descriptions of the various embodiments of the present invention have been presented for purposes of illustration, but are not intended to be exhaustive or limited to the embodiments described. Many modifications and variations will be apparent to those of ordinary skill in the art without departing from the scope and spirit of the described embodiments. The terminology used herein was chosen to best explain the principles of the embodiments, the practical application or technical improvement over technologies found in the marketplace, or to enable others of ordinary skill in the art to understand the embodiments described herein.

What is claimed is:

1. A method of fabricating an integrated circuit (IC), the method comprising:
   providing a wafer substrate having an embedded memory area interconnect structure and an embedded non-memory area interconnect structure, the memory area interconnect structure comprising metal interconnects formed within a first interlayer dielectric;
   recessing a portion of the memory area interconnect structure;
   forming a bottom electrode contact on the recessed portion of the memory area interconnect structure, wherein forming the bottom electrode contact on the recessed portion of the memory area interconnect structure comprises:
      depositing a dielectric material cap over the memory area interconnect structure, the first interlayer dielectric, the non-memory area interconnect structure, and in the recessed portion of the memory area, wherein the dielectric material cap is self-aligned in the recessed portion of the memory area interconnect structure;
      forming a cavity in the dielectric material cap, the cavity formed over the memory area interconnect structure; and
      forming the bottom electrode contact in the cavity;
   forming a bottom electrode over the bottom electrode contact;
   forming a protective dielectric layer over the non-memory area interconnect structure; and
   forming memory element stack layers on a portion of the bottom electrode.

2. The method of claim 1, wherein forming the memory element stack layers over the bottom electrode contact comprises:
   depositing the memory element stack layers over the protective dielectric layer and the bottom electrode contact; and
   selectively removing portions of the memory element stack layers and bottom electrode contact to form a pillar structure comprising remaining portions of the memory element stack layers and the bottom electrode.

3. The method of claim 2, wherein selectively removing portions of the memory element stack layers comprises an ion beam etching process.

4. The method of claim 2, wherein selectively removing portions of the memory element stack layers comprises a reactive ion etching process.

5. The method of claim 1 further comprising:
   forming a first top contact over the memory element stack layers; and forming a second top contact over the non-memory area interconnect structure;

wherein a first height between the first top contact and the memory area interconnect structure is larger than a second height between the second top contact and the non-memory area interconnect structure.

6. The method of claim 1, wherein a width of the bottom electrode is less than a memory element width of the memory element stack layers.

7. The method of claim 1, wherein forming the bottom electrode over the bottom electrode contact comprises:

forming a metal cap layer over the dielectric material cap and the bottom electrode contact; and removing a portion of the metal cap layer over the non-memory area interconnect structure to form the bottom electrode over the bottom electrode contact.

8. A method of fabricating an integrated circuit, the method comprising:

providing a wafer substrate having an embedded memory area interconnect structure and an embedded non-memory area interconnect structure, the memory area interconnect structure comprising metal interconnects formed within a first interlayer dielectric;

recessing a portion of the memory area interconnect structure;

forming a bottom electrode contact on the recessed portion of the memory area interconnect structure, wherein forming the bottom electrode contact on the recessed portion of the memory area interconnect structure comprises:

depositing a dielectric material cap over the memory area interconnect structure, the first interlayer dielectric, the non-memory area interconnect structure, and in the recessed portion of the memory area, wherein the dielectric material cap is self-aligned in the recessed portion of the memory area interconnect structure;

forming a cavity in the dielectric material cap, the cavity formed over the memory area interconnect structure; and forming the bottom electrode contact in the cavity;

forming a metal cap layer over the dielectric material cap and the bottom electrode contact;

forming a protective dielectric layer over the metal cap layer;

selectively etching the protective dielectric layer over the memory area to expose a portion of the metal cap layer; and forming memory element stack layers on the exposed portion of the metal cap layer.

9. The method of claim 8, wherein forming the memory element stack layers over the bottom electrode contact comprises:

depositing the memory element stack layers over the protective dielectric layer and the metal cap layer; and selectively removing portions of the memory element stack layers and the metal cap layer to form a pillar structure comprising remaining portions of the memory element stack layers and a bottom electrode.

10. The method of claim 9, wherein selectively removing the uncovered portions of the memory element stack layers comprises an ion beam etching process.

11. The method of claim 9, wherein selectively removing the uncovered portions of the memory element stack layers comprises a reactive ion etching process.

12. The method of claim 8 further comprising:

forming a first top contact over the memory element stack layers; and forming a second top contact over the non-memory area interconnect structure;

wherein a first height between the first top contact and the memory area interconnect structure is larger than a second height between the second top contact and the non-memory area interconnect structure.

13. The method of claim 9, wherein a width of the bottom electrode is less than a memory element width of the memory element stack layers.

14. The method of claim 8, wherein the memory element stack comprises a magnetic tunnel junction (MTJ) stack.

* * * * *